United States Patent
Nam et al.

(10) Patent No.: US 9,373,484 B2
(45) Date of Patent: Jun. 21, 2016

(54) PLASMA GENERATOR, MANUFACTURING METHOD OF ROTATING ELECTRODE FOR PLASMA GENERATOR, METHOD FOR PERFORMING PLASMA TREATMENT OF SUBSTRATE, AND METHOD FOR FORMING THIN FILM HAVING MIXED STRUCTURE BY USING PLASMA

(75) Inventors: Kee-Seok Nam, Gyeongsangnam-do (KR); Jung-Dae Kwon, Gyeongsangnam-do (KR); Yong Soo Jeong, Gyeongsangnam-do (KR); Gun Hwan Lee, Gyeonggi-do (KR); Jung Heum Yoon, Gyeongsangnam-do (KR); Sung Hun Lee, Gyeongsangnam-do (KR); Dong Ho Kim, Gyeongsangnam-do (KR); Jae Wook Kang, Gyeongsangnam-do (KR); Sung Gyu Park, Gyeongsangnam-do (KR); Chang Su Kim, Gyeongsangnam-do (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 338 days.

(21) Appl. No.: 14/241,223

(22) PCT Filed: Aug. 10, 2012

(86) PCT No.: PCT/KR2012/006384
§ 371 (c)(1),
(2), (4) Date: Apr. 8, 2014

(87) PCT Pub. No.: WO2013/022306
PCT Pub. Date: Feb. 14, 2013

(65) Prior Publication Data
US 2014/0217881 A1 Aug. 7, 2014

(30) Foreign Application Priority Data

Aug. 11, 2011 (KR) .................. 10-2011-0079921
Apr. 10, 2012 (KR) .................. 10-2012-0037089
Jul. 17, 2012 (KR) .................. 10-2012-0077974

(51) Int. Cl.
*H01J 37/32* (2006.01)
*C23C 16/509* (2006.01)
(Continued)

(52) U.S. Cl.
CPC ......... *H01J 37/32541* (2013.01); *C23C 16/503* (2013.01); *C23C 16/509* (2013.01);
(Continued)

(58) Field of Classification Search
CPC ................. H01J 37/32541; H01J 37/32559; H01J 37/32568; H01J 37/32825; H01J 9/022; C23C 16/503; C23C 16/509; H05H 1/2406
See application file for complete search history.

(56) References Cited

U.S. PATENT DOCUMENTS 7,585,386 B2 * 9/2009 Okumura .......... H01J 37/32009
118/724

FOREIGN PATENT DOCUMENTS

| JP | 2002-115073 A | 4/2002 |
| JP | 2003-142415 A | 5/2003 |

(Continued)

OTHER PUBLICATIONS

Extended European Search Report Appln. No. EP 12 82 1442; Dated Dec. 9, 2014.
International Search Report mailed Feb. 1, 2013; PCT/KR2012/006384.

*Primary Examiner* — Mary Ellen Bowman
(74) *Attorney, Agent, or Firm* — Ladas & Parry LLP

(57) ABSTRACT

A plasma generator according to an embodiment of the present invention is provided to generate a high density and stable plasma at near atmospheric pressure by preventing a transition of plasma to arc. The plasma generator includes a plate-shaped lower electrode for seating a substrate; and a cylindrical rotating electrode on the plate-shaped lower electrode, wherein the cylindrical rotating electrode includes an electrically conductive body that is connected to a power supply and includes a plurality of capillary units on an outer circumferential surface of the electrically conductive body; and an insulation shield layer that is made of an insulation material or a dielectric material, exposes a lower surface of the plurality of capillary units, and shields other parts.

18 Claims, 23 Drawing Sheets

(51) Int. Cl.
   *H05H 1/24*      (2006.01)
   *H01J 9/02*      (2006.01)
   *C23C 16/503*    (2006.01)
   *H05H 1/48*      (2006.01)

(52) U.S. Cl.
   CPC .......... *H01J 9/022* (2013.01); *H01J 37/32559* (2013.01); *H01J 37/32568* (2013.01); *H01J 37/32825* (2013.01); *H05H 1/2406* (2013.01); *H01J 2237/327* (2013.01); *H05H 2001/2431* (2013.01); *H05H 2001/485* (2013.01); *H05H 2001/486* (2013.01)

(56) References Cited

FOREIGN PATENT DOCUMENTS

| | | |
|---|---|---|
| JP | 2005-148564 A | 6/2005 |
| JP | 2006-145865 A | 6/2006 |
| JP | 2007-107083 A | 4/2007 |
| KR | 20020066467 A | 8/2002 |
| KR | 1020100034773 A | 4/2010 |
| KR | 1020110031629 A | 3/2011 |
| WO | 02065820 A1 | 8/2002 |

\* cited by examiner (a)

(b)

(c)

(a)

(b)

(c)

PLASMA GENERATOR, MANUFACTURING METHOD OF ROTATING ELECTRODE FOR PLASMA GENERATOR, METHOD FOR PERFORMING PLASMA TREATMENT OF SUBSTRATE, AND METHOD FOR FORMING THIN FILM HAVING MIXED STRUCTURE BY USING PLASMA

TECHNICAL FIELD

The present invention relates to a plasma generator. More particularly, the present invention relates to plasma generating electrodes and method for performing treatments of substrates using the same.

The present invention relates to a method for forming a thin film. More particularly, the present invention relates to a method for forming a thin film using plasma.

BACKGROUND ART

Generally, plasma is an electrically conductive neutral and ionized gas, namely an almost neutral gas state in which ions or electrons rarely exist in a large amount of non-ionized gas, is categorized into high-temperature and low-temperature plasmas depending on the temperature, and has extremely high chemical or physical reactivity. Substrate treatment technologies using plasma have recently been used in various industrial fields, e.g., semiconductor devices, solar cells, displays, etc. For example, low temperature plasma is used in fields in which various substances or materials such as metals, semiconductors, polymers, nylon, plastics, paper, fabric, ozone, etc. are synthesized or surface properties of them are changed to increase the bond strength and improve various properties including dyeing and printability, and in various fields such as thin film synthesis or cleaning of semiconductors, metals and ceramics.

Meanwhile, thin film formation technology using plasma has recently been used in various industrial fields, e.g., semiconductor devices, solar cells, displays, etc. Particularly, semiconductor thin films are used as active layers or gate electrodes for semiconductor devices or display devices, and used as diode structures for converting optical signals to electrical signals in solar cells. In the above described semiconductor thin films, control of crystal structures significantly affects performance or reliability of devices. For example, although thin film solar cells using amorphous silicon are advantageous in realizing a high speed process, they have problems of a very low efficiency of energy conversion, compared with solar cells using single crystal silicon or polycrystalline silicon or solar cells using compound semiconductors, and of efficiency degradation with time due to Staebler-Wronski effect when exposed to light for a long time. Therefore, in an effort to remedy the light-induced degradation of the amorphous silicon, researches into controlling degrees of crystallization, such as synthesizing amorphous silicon and single crystal silicon, are being carried out lately.

DISCLOSURE

Technical Problem

Generally, since low temperature plasma is generated within a vacuum chamber at low pressure, it requires expensive devices for maintaining vacuum state and therefore has limitations for being used to treat large area objects to be treated. To overcome this, efforts go into generating plasma at near atmospheric pressure. However, a device for generating plasma at near atmospheric pressure has problems of having a phenomenon of plasma being transitioned to arc, of requiring additional subsequent processes when carrying out deposition and/or etching processes on objects to be treated due to inability to accurately and selectively generate atmospheric pressure plasma, and of having difficulty in treating when objects to be treated are large. The present invention has been made in an effort to solve various problems including the above problems. The present invention has an object of providing a high density plasma generator that can be used at near atmospheric pressure, and a method for performing a plasma treatment of substrates using the plasma generator.

Meanwhile, a method generally used for controlling a degree of crystallinity is to control the degree of crystallinity by controlling the percentage of reaction gas. However, the method for controlling a degree of crystallinity using the fraction of gas components that are included in the reaction gas has difficulty in controlling a degree of crystallinity of thin films since the degree of crystallinity shows an exponential growth beyond a specific percentage. Therefore, a task of the present invention is to provide a method for forming a thin film having a mixed structure, that is capable of controlling a degree of crystallinity of a thin film more economically and simply.

However, the above tasks are illustrative only, and do not limit the scope of the present invention.

Technical Solution

According to an aspect of the present invention, a plasma generator that includes a plate-shaped lower electrode for seating a substrate; and a cylindrical rotating electrode on the plate-shaped lower electrode is provided, and the cylindrical rotating electrode includes an electrically conductive body that is connected to a power supply and includes a plurality of capillary units on an outer circumferential surface of the electrically conductive body; and an insulation shield layer that is disposed on the outer circumferential surface of the body and exposes a lower surface of the plurality of capillary units.

The shield layer may expose the lower surface of the plurality of capillary units and be arranged to surround a side surface that surrounds the lower surface.

The plurality of capillary units may be linearly arranged. The plurality of capillary units may extend along the direction of a rotation shaft of the body. Here, the plurality of capillary units may be regularly arranged with a constant spacing.

Furthermore, the plasma generator may include a chamber in which the plate-shaped lower electrode and the cylindrical rotating electrode are disposed, and the chamber may include a reaction gas inlet and a reaction gas outlet.

Plasma may be generated between the cylindrical rotating electrode and the plate-shaped lower electrode, and an on/off control of plasma discharge may be carried out by controlling the number of revolutions of the cylindrical rotating electrode and the number of the capillary units.

The body may include at least one of an electrically conductive metal, an electrically conductive ceramic, an electrically conductive carbon body and an electrically conductive polymer.

The shield layer may include at least one of alumina ($Al_2O_3$), silicon carbide (SiC), silicon nitride ($Si_3N_4$), quartz ($SiO_2$), magnesium oxide (MgO) and Teflon (PTFE).

The width of the capillary units may range from 100 μm to 10 mm, and the aspect ratio of the capillary units may range from 1 to 200.

The thickness of the shield layer may range from 10 µm to 10 mm.

According to another aspect of the present invention, a method for performing a plasma treatment of a substrate is provided. The method includes the steps of: seating a substrate on a plate-shaped lower electrode; injecting a reaction gas onto the substrate; and inducing a chemical reaction of the reaction gas by generating a plasma between the plate-shaped lower electrode and the cylindrical rotating electrode, and the cylindrical rotating electrode includes an electrically conductive body having plurality of capillaries on the outer circumferential surface of the electrically conductive body, and a shield layer that is made of an insulation material or a dielectric material and exposes the lower surface of the plurality of capillary units and shields other parts, and the plasma is generated between the lower surface of the capillary units of the cylindrical rotating electrode and the substrate on the plate-shaped lower electrode.

According to an aspect of the present invention, a manufacturing method of a rotating electrode for a plasma generator is provided. The method includes the steps of: proving an electrically conductive body that includes a plurality of capillary units; and forming an insulation shield layer on the outer circumferential surface of the body to expose at least part of the lower surface of the plurality of capillary units.

The step of forming an insulation shield layer may include the steps of: forming a dielectric layer to cover the outer circumferential surface of the body; and selectively removing the dielectric layer on at least part of the lower surface of the plurality of capillary units.

The electrically conductive body may be made of an electrically conductive material that includes aluminum, and the step of forming a dielectric layer may include the step of forming an alumina layer on the electrically conductive body by an anodic oxidation method or thin film deposition method.

The electrically conductive body may be made of an electrically conductive material except aluminum, and the step of forming a dielectric layer may include the steps of: forming an aluminum layer to cover the outer circumferential surface of the body by a thin film deposition method; and performing a phase transformation in which the aluminum layer is transformed to an alumina layer by an anodic oxidation method.

The electrically conductive body may be made of an electrically conductive material except aluminum, and the step of forming a dielectric layer may include the step of forming an alumina layer to cover the outer circumferential surface of the body by a thin film deposition method.

The step of forming a dielectric layer may be carried out by an anodic oxidation method or thin film deposition method.

The step of selectively removing the dielectric layer may be carried out by a diamond cutting method or a laser cutting method.

The step of forming an insulation shield layer may include the steps of: forming a mask layer on the lower surface of the plurality of capillary units; and selectively forming a dielectric layer on the outer circumferential surface of the body that is exposed from the mask layer.

The dielectric layer may be formed by an anodic oxidation method.

The method may further include the step of removing the mask layer, after the step of forming a dielectric layer.

The step of proving an electrically conductive body that includes a plurality of capillary units may include the steps of: providing a cylindrical core that includes a first electrically conductive substance; forming an outer circumferential layer that includes a second electrically conductive substance on the cylindrical core; and forming a plurality of capillary units by removing part of the outer circumferential surface so that the cylindrical core is exposed and concave-convex shapes appear.

Furthermore, the step of forming an insulation shield layer may include the step of forming a dielectric layer on the outer circumferential layer in which concave-convex shapes appear so that at least part of the lower surface of the capillary units is exposed, under conditions in which the dielectric layer can be selectively formed only on the second electrically conductive substance of the first and second electrically conductive substances. Here, the first electrically conductive substance may include iron, the second electrically conductive substance may include aluminum, and the dielectric layer may include aluminum oxide ($Al_2O_3$). The dielectric layer may be formed by an anodic oxidation of aluminum.

The electrically conductive body may be made of an electrically conductive material that includes aluminum, and the step of forming a dielectric layer may include the step of forming an alumina layer on the electrically conductive body by an anodic oxidation method or a thin film deposition method.

The electrically conductive body may be made of an electrically conductive material except aluminum, and the step of forming a dielectric layer may include the steps of: forming an aluminum layer to cover the outer circumferential surface of the body by a thin film deposition method; and performing a phase transformation in which the aluminum layer is transformed to an alumina layer by an anodic oxidation method.

The electrically conductive body may be made of an electrically conductive material except aluminum, and the step of forming a dielectric layer may include the step of forming an alumina layer to cover the outer circumferential surface of the body by a thin film deposition method.

The plurality of capillary units may be formed in a stripe pattern, and the stripe pattern may be formed to extend along the direction of a rotation shaft of the body. Furthermore, the stripe pattern may be regularly arranged with a constant spacing.

The shield layer may include at least one of alumina ($Al_2O_3$), silicon carbide (SiC), silicon nitride ($Si_3N_4$), quartz ($SiO_2$), magnesium oxide (MgO) and Teflon (PTFE).

According to another aspect of the present invention, a manufacturing method of a rotating electrode for a plasma generator is provided. The method includes the steps of: forming a plurality of capillary units on an outer circumferential surface of the cylindrical body; forming a dielectric layer to cover the outer circumferential surface of the body; and forming an insulation shield layer that exposes at least the lower surface of the plurality of capillary units by selectively removing part of the dielectric layer.

The method may further include the step of forming an aluminum or aluminum alloy layer to cover the outer circumferential surface of the body, before the step of forming a dielectric layer.

The dielectric layer may be formed by performing anodic oxidation of the aluminum or aluminum alloy layer.

According to an aspect of the present invention, a plasma generator is provided. The plasma generator includes a first electrode for seating a substrate; and a second electrode that is spaced apart from the first electrode and includes a plurality of capillary units that includes a body that is disposed on a surface opposed to the first electrode and defines a cavity therebetween, and an electrically conductive porous layer on the cavity.

The electrically conductive porous layer may include a plurality of inter-connected micropores to allow gases into the cavity.

The sizes of the of micropores may correspond to ASTM No 5 to 400.

The body of the plurality of capillary units may be an insulation material.

The insulation material may include at least one of alumina ($Al_2O_3$), silicon carbide (SiC), silicon nitride ($Si_3N_4$), quartz ($SiO_2$), magnesium oxide (MgO) and Teflon (PTFE).

The body of the plurality of capillary units may be an insulation material, and the second electrode may include an insulation layer that shields a side surface and an upper surface of the body.

The plasma generator may further include a channel that is disposed on the electrically conductive porous layer so that a discharge gas is injected through the electrically conductive porous layer into the cavity.

The plasma generator may further include a dielectric layer between the first electrode and the substrate.

The first electrode may be a plate-shaped electrode, and the second electrode may be a plate-shaped electrode that faces the first electrode.

The electrically conductive porous layer may include at least one of an electrically conductive metal, an electrically conductive alloy, an electrically conductive ceramic, an electrically conductive carbon body and an electrically conductive polymer.

The cavity may be regularly arranged with a constant spacing.

The width of the cavity ranges from 100 μm to 10 mm, and the aspect ratio of the cavity ranges from 1 to 200.

The plasma generator may further include a chamber in which the plate-shaped first electrode and the second electrode are disposed, and the chamber may include a discharge gas inlet and a discharge gas outlet.

According to another aspect of the present invention, a method for performing a plasma treatment of a substrate is provided. The method includes the steps of: preparing a plasma generator that includes a first electrode, a second electrode that includes a plurality of capillary units that includes a body that is spaced apart from the first electrode, is disposed on a surface opposed to the first electrode and defines a cavity therebetween, and an electrically conductive porous layer on lower surface of the cavity; seating a substrate on the first electrode; injecting a discharge gas through the electrically conductive porous layer into the cavity of the plurality of capillary units; and generating a plasma between the lower surface of the plurality of capillary units and the substrate on the first electrode.

A method for forming a thin film having a mixed structure according to an embodiment of the present invention is provided. The method includes the steps of: injecting a reaction gas between a substrate and a cylindrical rotating electrode; inducing a chemical reaction of the reaction gas between the substrate and the rotating electrode by generating a plasma between the substrate and the rotating electrode; and alternately stacking at least one crystalline layer and at least one amorphous layer on the substrate by relatively moving the substrate with respect to the rotating electrode while the rotating electrode is rotated.

In the above described method, the step of alternately stacking may include the step of alternately stacking at least one crystalline layer and at least one amorphous layer every time the substrate is scanned only once along one direction.

In the above described method, the step of alternately stacking may be carried out by relatively scanning back and forth the substrate with respect to the rotating electrode at least once.

In the above described method, the step of alternately stacking may include the step of alternately stacking a plurality of crystalline layers and a plurality of amorphous layers on the substrate by continuously circulating the substrate between a pair of rollers by a roll-to-roll process.

In the above described method, the substrate may be provided on a belt that continuously circulates between the pair of rollers and a pair of rotating electrodes may be provided above and below the outer side of the belt, and the step of inducing a chemical reaction of the reaction gas may be carried out by generating a plasma between the pair of rotating electrodes and the substrate.

In the above described method, the alternately stacking may be carried out by continuously moving the substrate between a pair of reels by a reel-to-reel process.

A method of forming a thin film having a mixed structure according to another embodiment of the present invention is provided. The method includes the steps of: injecting a reaction gas between a substrate and a cylindrical rotating electrode within a chemical vapor deposition (CVD) device; inducing a chemical reaction of the reaction gas between the substrate and the rotating electrode by generating a plasma between the substrate and the rotating electrode; and forming an amorphous layer that includes microcrystals on the substrate by relatively moving the substrate at a first velocity with respect to the rotating electrode while the rotating electrode is rotated. The first velocity may be greater than a second velocity, the second velocity being a velocity of movement of the substrate for forming a mixed structure in which at least one crystalline layer and at least one amorphous layer are alternately stacked on the substrate.

In the above described method, the reaction gas may include a silicon source gas, the microcrystal may include a silicon microcrystal, and the amorphous layer may include an amorphous silicon layer.

Advantageous Effects

An embodiment of the present invention as describe above, is capable of stably generating a plasma at near atmospheric pressure by preventing a transition of plasma to arc. A method of manufacturing a plasma generator according to another embodiment of the present invention as described above, is capable of providing a rotating electrode for a plasma generator that is capable of stably generating a plasma at near atmospheric pressure by preventing a transition of plasma to arc. Yet another embodiment of the present invention as described above, is capable of inducing a stable glow discharge and stably generating a high density plasma at near atmospheric pressure by preventing a transition of plasma to arc. Still another embodiment of the present invention as described above, is capable of forming a thin film having a mixed structure by relatively moving a substrate with respect to a rotating electrode and scanning the substrate along at least one direction. These methods are easier to control and more economical than a method of controlling the percentage of reaction gas. However, these effects do not limit the scope of the present invention.

BEST MODE

Figure 1:
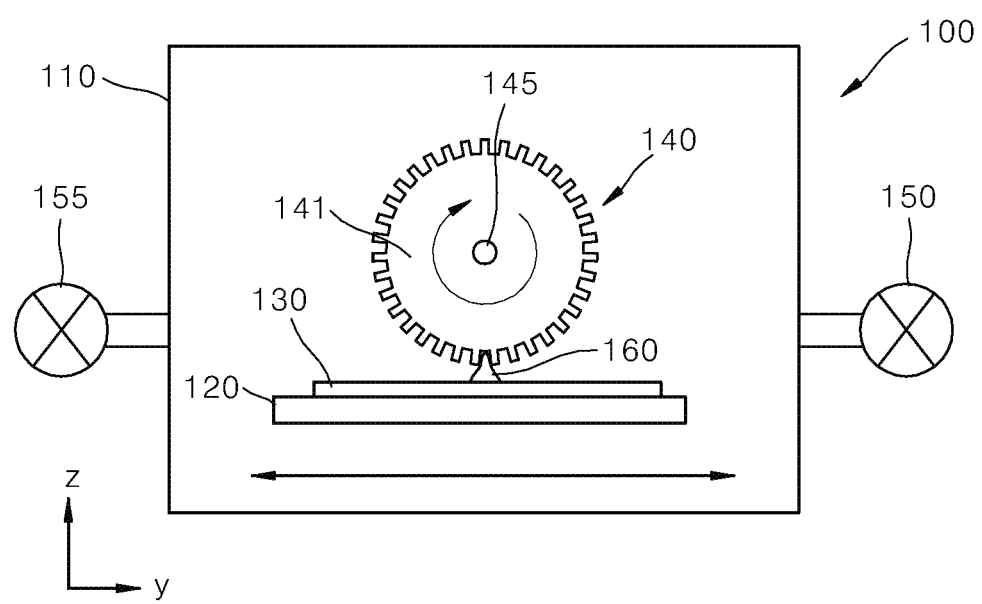
FIG. 1 is a schematic cross-section of a plasma generator 100 according to an embodiment of the present invention.

Hereinafter, embodiments of the present invention will be described in detail with reference to the accompanying drawings. However, the present invention should not be construed as limited to the embodiments set forth herein. Rather, the present invention may be embodied in different forms. These embodiments are provided so that this disclosure will be thorough and complete, and will fully convey the scope of the invention to those skilled in the art. Furthermore, the size of each component shown in the drawings may be exaggerated for clarity of illustration.

In the embodiments set forth below, the x, y, and z axes should not be construed as limited to three Cartesian axes. Rather, they can be construed broadly to include the three Cartesian axes. For example, although the x, y, and z axes may intersect each other at right angles, they may refer to different directions that do not intersect each other at right angles.

Capillary Discharge Plasma Generator

Figure 2:
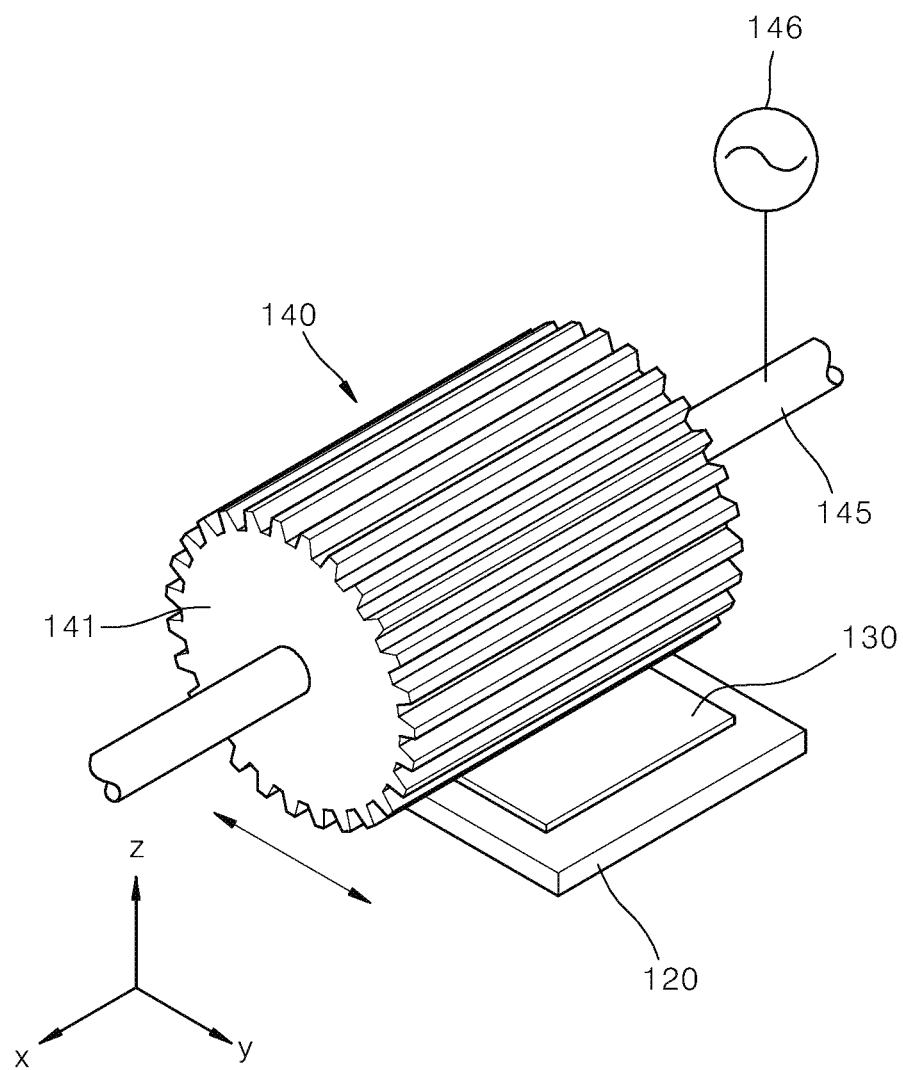
FIG. 2 is a schematic perspective view of a plasma generator 100 of FIG. 1, showing the arrangement of a rotating electrode and a substrate.

FIG. 1 is a schematic cross-section of a plasma generator 100 according to an embodiment of the present invention. FIG. 2 is a schematic perspective view of a plasma generator 100 of FIG. 1, showing the arrangement of a rotating electrode and a substrate.

Referring to FIGS. 1 and 2, a chamber 110 for defining a reaction space is provided. An injection valve 150 for injecting reaction gases into the chamber 110 may be positioned at one side of the chamber 110, and an exhaust valve 155 for discharging reaction gases in the chamber 110 to the outside may be positioned at the other side of the chamber 110. The shape of the chamber 110 is merely illustrative and does not limit the scope of this embodiment. For example, the chamber 110 may be provided having the shape of a polygon as shown in FIG. 1, or a circle or dome.

The injection valve 150 is connected to a gas supplier (not shown), and a gas flow meter to control a flow rate may be connected between the injection valve 150 and the gas supplier. Selectively, the exhaust valve 155 may be connected to a pump (not shown) to easily discharge reaction gases or other gas to the outside. The pump, however, may be omitted if the chamber 110 operates at atmospheric pressure. The shapes and arrangements of the injection valve 150 and the exhaust valve 155 may be properly adjusted and do not limit the scope of this embodiment.

A substrate 130 may be disposed within the chamber 110 so that the substrate 130 is seated on a plate-shaped lower electrode 120. The plate-shaped lower electrode 120 may include a heater to heat the substrate 130. For example, the plate-shaped lower electrode 120 may be provided having a hot plate with a heater installed therein. The substrate 130 may be provided variously. For example, the substrate 13 may be provided having a semiconductor wafer such as silicon to manufacture semiconductor devices, or may be provided having a glass substrate or plastic substrate to manufacture display devices or solar cells. On the other hand, in other embodiment, the substrate 130 may be provided being integrally formed with the lower electrode 120 or provided on the lower electrode 120, in a roll-to-roll or reel-to-reel manner.

A rotating electrode 140 may be provided on the plate-shaped lower electrode 120 so that the rotating electrode 140 and the substrate 130 face each other. For example, the rotating electrode 140 may be provided having a rotation shaft 145 at the center so that the rotating electrode 140 is rotatable. For example, the rotating electrode 140 may be provided having various shapes, e.g., the shape of a cylinder. Another example of the rotating electrode 140 may have the shape of a polygon with a structure symmetrical about the rotation shaft 145.

The rotation shaft 145 may be connected to a driving unit (not shown) to receive a driving force. The rotating electrode 140 may be connected to a power supply unit 146 to be provided with electricity, and, for example, the rotation shaft 145 may be connected to the power supply unit 146. The power supply unit 146 may be an alternating current (AC) or a direct current (DC) power supply. For example, the power supply unit 146 may supply an AC electric power having a frequency that ranges from 50 Hz to 10 GHz.

The cylindrical rotating electrode 140 rotates about the rotation shaft 145, and may extend in the positive or negative direction of x-axis. The plate-shaped lower electrode 120 may move perpendicularly to the rotating shaft 145, e.g., in the positive or negative direction of y-axis. Therefore, the substrate may be moved with respect to the cylindrical rotating electrode 140. A second example may be that the plate-shaped lower electrode 120 is fixed, and the cylindrical rotating electrode 140 may rotate and at the same time move in the positive or negative direction of y-axis.

When reaction gases flow through the injection valve 150 into the chamber 110 and electric power is supplied to the cylindrical rotating electrode 140, plasma can be generated between the cylindrical rotating electrode 140 and the substrate 130. The plasma may induce chemical reactions by activating the reaction gases. To control the generation of the plasma, a gap between the cylindrical rotating electrode 140 and the substrate 130 may need to be properly controlled, e.g., in the range of 0.1 mm to 5 mm. Meanwhile, inert gases together with the reaction gases may be injected into the chamber 110 to control or dilute the atmosphere in the chamber 110.

Capillary units 144 of the body 141 of the rotating electrode 140 may be provided in a stripe pattern, as shown in FIG. 2. For example, the stripe pattern may extend in parallel with the rotation shaft 145. Furthermore, the stripe pattern may be regularly arranged with a constant spacing. The direction of the stripe pattern is perpendicular to the direction that the substrate moves and therefore may be advantageous for controlling the uniformity of plasma treatments. However, in a modified embodiment of this embodiment, the direction of the stripe pattern may be arranged to extend in the circumferential direction of the rotating electrode 140. Furthermore, in another modified embodiment of this embodiment, the capillary units 144 may be arranged in various patterns, e.g., a spiral pattern.

A plasma treatment of the substrate 130 can be performed using the above described plasma generator 100. First, the substrate 130 may be seated on the plate-shaped lower electrode 120. Then, reaction gases may be supplied to the substrate 130 by injecting the reaction gases through the injection valve 150 into the chamber 110. Then, chemical reactions of the reaction gases may be induced by generating plasma between the plate-shaped lower electrode 120 and the rotating electrode 140.

According to the above described plasma generator, the generation of plasma is controlled and therefore the plasma can be maintained at near atmospheric pressure. The plasma may be used to deposit a thin film on the substrate 130 or etch a thin film.

Figure 3:
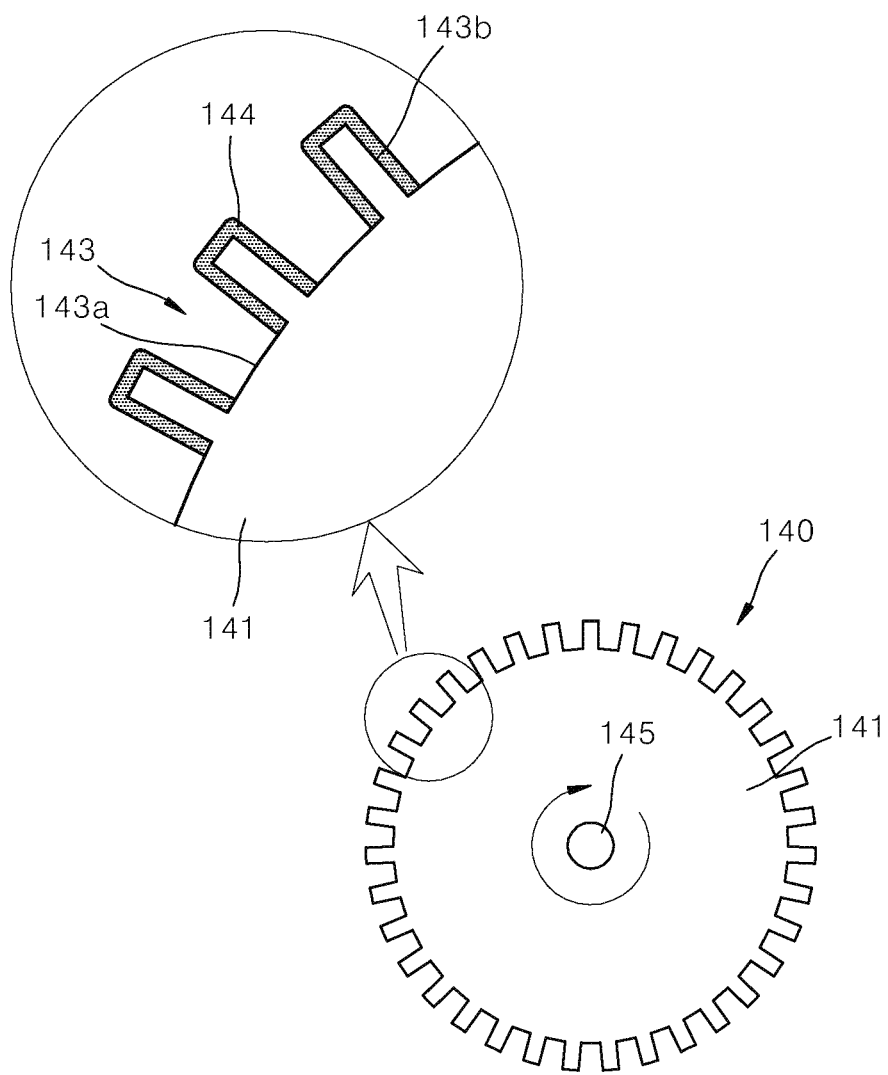
FIG. 3 is a partially enlarged schematic view of a rotating electrode 140 shown in FIG. 1.

FIG. 3 is a partially enlarged schematic view of a cylindrical rotating electrode 140 shown in FIG. 1.

Referring to FIG. 3, the cylindrical rotating electrode 140 may include an electrically conductive body 141 that is connected to the rotation shaft 145. The body 141 may include various electrically conductive materials, e.g., at least one of an electrically conductive metal, an electrically conductive ceramic, an electrically conductive carbon body, and an electrically conductive polymer.

Furthermore, a plurality of capillaries 143 is provided on the outer circumferential surface of the body 141. The capillaries 143 includes a space defined by a lower surface 143a and a sidewall 143b, and the space may have the shape of a trench. However, the shape of the space is merely illustrative and does not limit the scope of the embodiment. For example, the space defined by the lower surface 143a and the sidewall 143b may have a long and narrow shape in the form of a capillary tube. Furthermore, a cross-section that is parallel to the lower surface and/or the sidewall may have a concave pattern in the shape of a circle, an ellipse, or a polygon.

The capillary units 143 may be arranged in a linear configuration as shown in FIG. 2. For example, the linear configuration may extend in parallel to the rotation shaft (in the positive or negative direction of x-axis in FIG. 2) and be regularly arranged with a constant spacing. The direction of the linear configuration is perpendicular to the direction that the substrate moves and therefore may be advantageous for controlling the uniformity of plasma treatments. However, in a modified embodiment of this embodiment, the direction of the linear configuration may be arranged to extend in the circumferential direction of the rotating electrode 140. Furthermore, in another modified embodiment of this embodiment, the capillary units 143 may be arranged in various patterns, e.g., a spiral pattern.

A shield layer 144 that is made of an insulation material or a dielectric material may be disposed on the outer circumferential surface of the body 141 so that at least the lower surface 143a of the capillary units 143 is exposed. For example, the shield layer 144 exposes the lower surface 143a of the capillary units 143 and shields other parts of the circumferential surface of the body 141. The shield layer 144 may include various dielectric materials, e.g., at least one of alumina ($Al_2O_3$), silicon carbide (SiC), silicon nitride ($Si_3N_4$), quartz ($SiO_2$), magnesium oxide (MgO) and Teflon (PTFE).

In the above structure, areas except the lower surface 143a of the capillary units 143, are surrounded by the shield layer 144 and therefore generation of plasma may occur in all directions (particularly, in a radial direction) from the capillary units 143 due to a concentration of electric potential. That is, as an electric field is applied to the cylindrical rotating electrode 140, the electric field accumulates and intensifies on the lower surface 143a of the capillary units 143, thereby achieving the effect of capillary discharge.

The width of the lower surface 143a and the height of the sidewall 143b of the capillary units 143 may be controlled to control the generation of plasma. For example, an on/off control of plasma discharge can be carried out by controlling the number of revolutions of the cylindrical rotating electrode 140, the capillary units 143, and/or the shape thereof, etc. This structure may help control the generation of plasma and prevent the generation of arc, thereby stably maintaining plasma even at near atmospheric pressure.

For example, the width of the lower surface 143a of the capillary units 143 may range from 100 µm to 10 mm, and the aspect ratio 142b/142a of the capillary units 143 may range from about 1 to about 200. The aspect ratio of the sidewalls 143b represents the ratio of the height of the sidewall 143b to the width of the lower surface 143a. Meanwhile, the thickness of the shield layer 144 may range from 10 µm to 10 mm. If the thickness of the shield layer 144 is equal to or smaller than 10 µm, discharge effects are not enough and therefore arc is generated. If the thickness of the shield layer 144 is equal to or greater than 10 mm, strong discharge effects are achieved but the discharge inception and sustain voltages may become too high.

Plasma treatments of the substrate 130 may be performed using the above described plasma generator 100. First, the substrate 130 may be seated on the plate-shaped lower electrode 120. Then, reaction gases may be injected into the chamber 110 and onto the substrate 130. Then, chemical reactions of the reaction gases may be induced by generating plasma between the plate-shaped lower electrode 120 and the cylindrical rotating electrode 140. According to the above described plasma generator, the generation of plasma is controlled and therefore the plasma can be maintained at near atmospheric pressure. The plasma may be used to deposit a thin film on the substrate 130 or etch a thin film.

Figure 4:
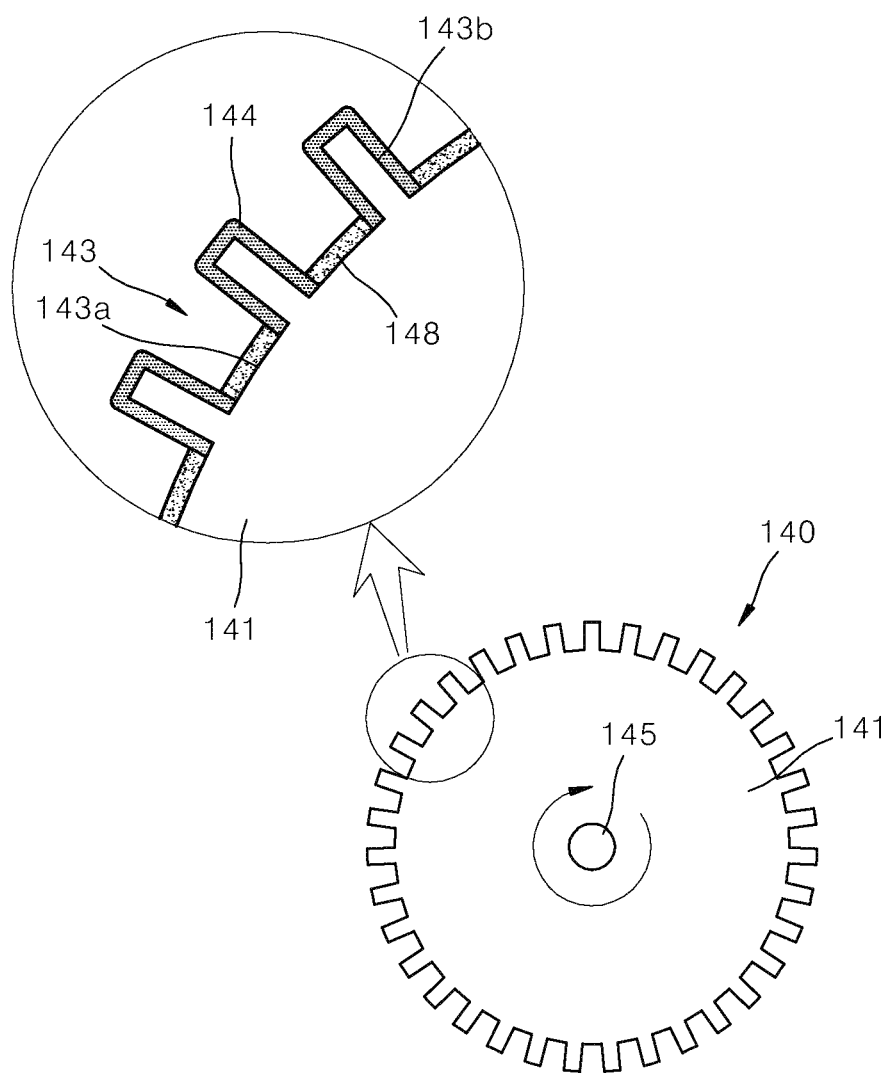
FIG. 4 is another partially enlarged schematic view of a rotating electrode 140 shown in FIG. 1.

FIG. 4 is another partially enlarged schematic view of a cylindrical rotating electrode 140 shown in FIG. 1.

Referring to FIG. 4, an electrically conductive layer 148 is formed on the lower surface 143a of the capillary units 143. Since elements other than the electrically conductive layer 148 shown in FIG. 4 are the same as those shown in FIG. 3, overlapping explanations thereof will be omitted.

The electrically conductive layer 148, for example, may include at least one of a metal, an alloy, an electrically conductive ceramic, an electrically conductive carbon body, and an electrically conductive polymer, each having a secondary electron emission coefficient higher than the lower surface 143a. The electrically conductive layer 148 may cover at least the lower surface 143a of the capillary units 143, and may cover at least part of the lower surface 143a except the sidewall 143b.

Hereinafter, Experimental Examples are provided to help understand the present invention. However, Experimental Examples below are embodiments of the those shown in FIG. 3 and are provided merely to aid in understanding the present invention, and do not limit the scope of the present invention. The plate-shaped lower electrode in the Comparative and Experimental Examples below included copper and was maintained at room temperature.

Comparative Example 1

In this comparative example, the gap between the substrate and the rotating electrode was controlled to be 0.4 mm, the exhaust valve was open to evacuate the chamber to a vacuum pressure of $2.5 \times 10^{-2}$ Torr and then the exhaust valve was closed. Then, the injection valve was open to inject hydrogen and helium gases into the chamber to a vacuum pressure of 300 Torr. The flow rate of the hydrogen gas was about 10 sccm, and the flow rate of the helium gas was about 10 slm.

A rotating electrode on which no capillary units are formed was rotated at 1000 rpm and a frequency of 150 MHz was applied by a power supply at 200 W. An OES (optical emission spectroscopy) system was installed at a position where plasma can be monitored in the chamber and the intensity of light emitted from the plasma was measured at various wavelengths.

Furthermore, the experiment was repeated while hydrogen and helium gases were injected at the same flow rate as the above flow rate and the pressure in the chamber was changed to 400 and 500 Torr.

Figure 5:
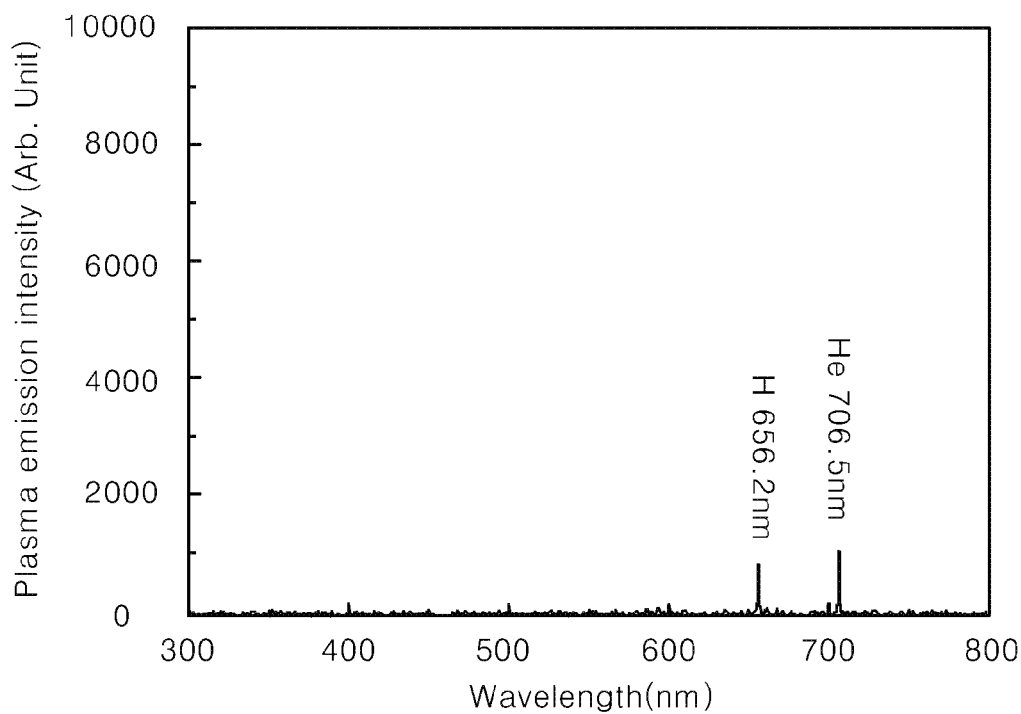
FIGS. 5 and 7 show the result of OES analysis of plasma measured according to comparative examples.

Referring to FIG. 5, it was confirmed that the peak wavelengths of hydrogen and helium were identified at 656.2 nm and 706 nm, respectively. That is, it is confirmed that a helium plasma and a hydrogen plasma were generated.

Comparative Example 2

Figure 6:
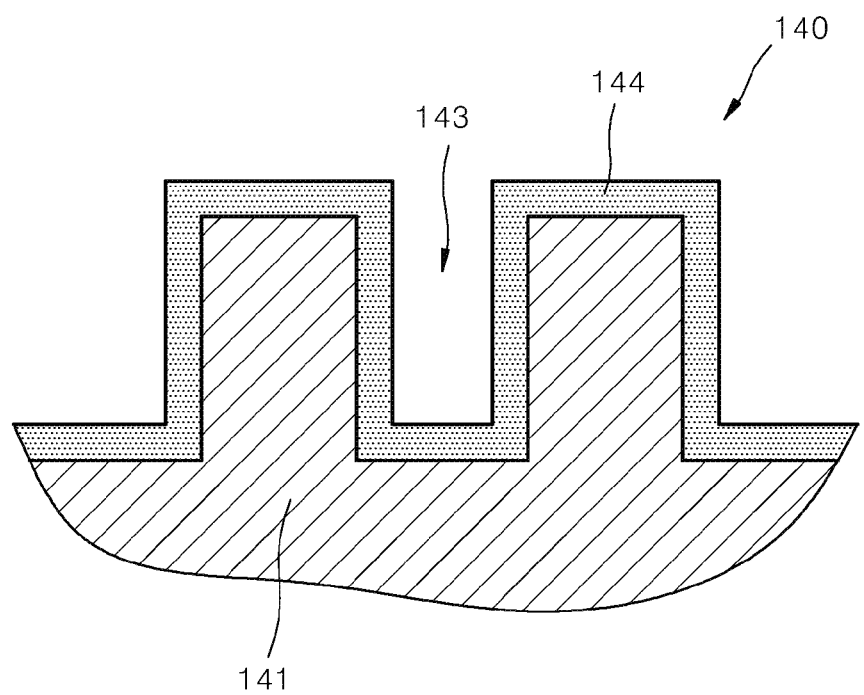
FIG. 6 is a schematic partial cross-sectional view of a rotating electrode according to a comparative example of the present invention.

FIG. 6 is a schematic partial cross-sectional view of a rotating electrode according to a comparative example of the present invention. Referring to FIG. 6, a shield layer 144 was formed all over the outer circumferential surface of the rotating electrode.

Figure 7:
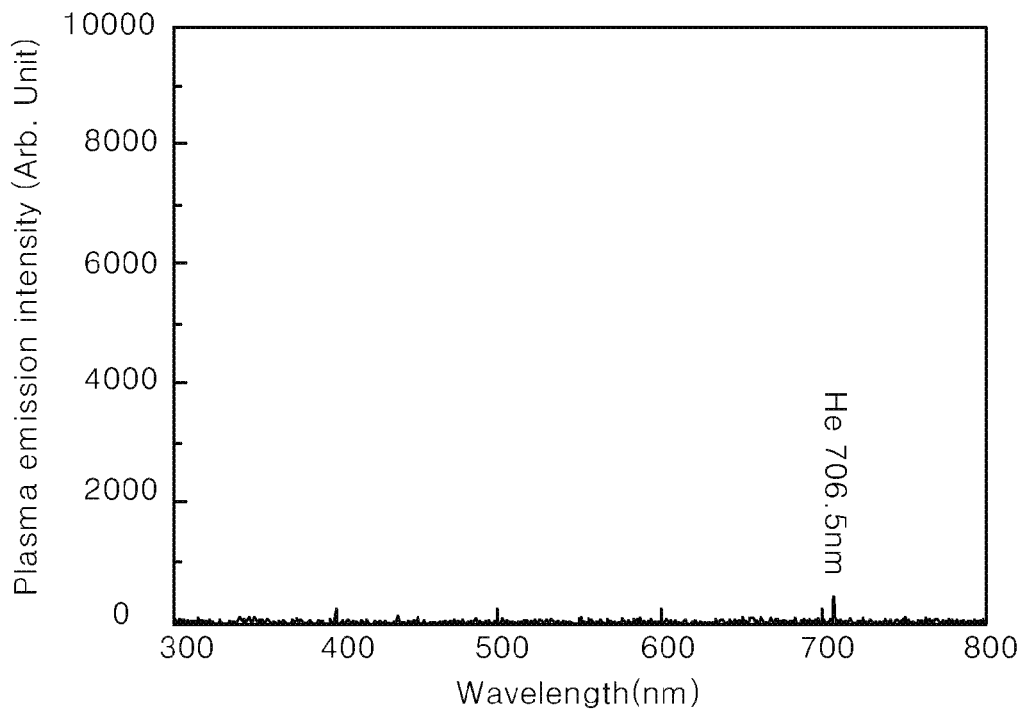

FIG. 7 shows the result of OES analysis of a plasma measured using the plasma generator of FIG. 6.

Referring to FIG. 7, a weak peak wavelength of helium was identified, but the peak wavelength of hydrogen was almost unidentifiable.

Experimental Example 1

Figure 8:
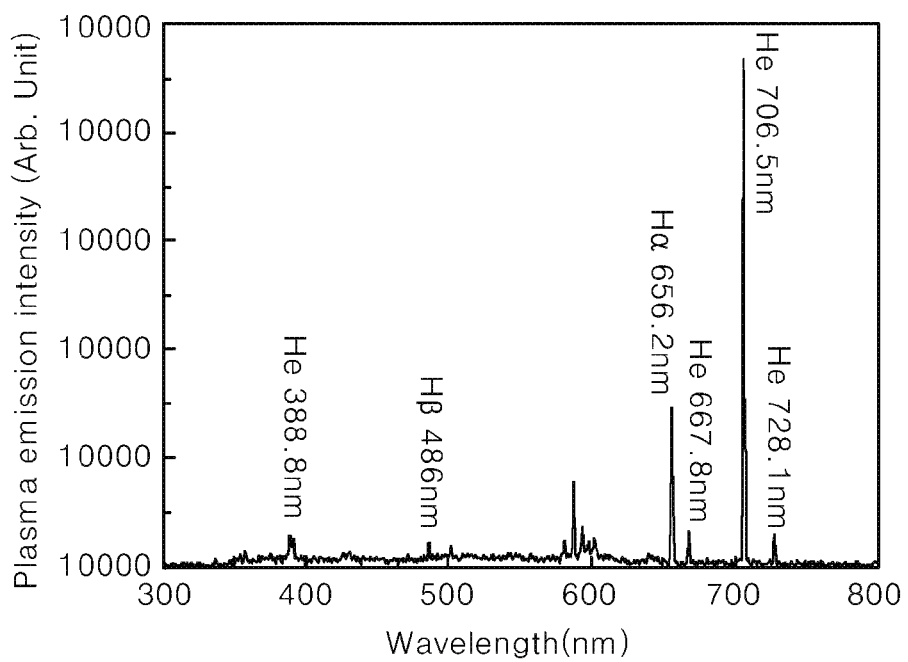
FIG. 8 shows the result of OES analysis of plasma measured according to an experimental example of the present invention.

FIG. 8 shows the result of OES analysis of a plasma measured according to an experimental example of the present invention, wherein the shield layer 144 on the lower surface 143a of the capillary unit 143 to induce the effect of the present invention. The same plasma generator as that of FIG. 1 was used in this experimental example.

Referring to FIG. 8, various sub-peak wavelengths as well as the peak wavelength (706.5 nm) of helium were observed.

Figure 9:
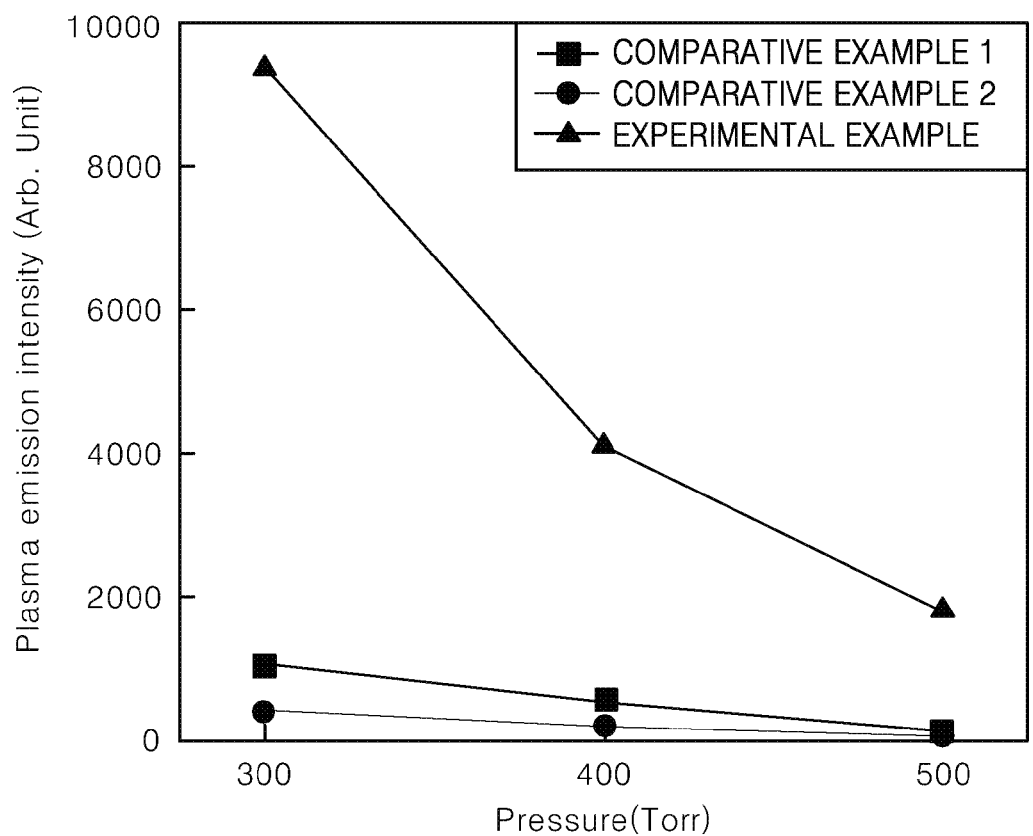
FIG. 9 shows plasma emission intensity versus pressure for the comparative examples and experimental example.

FIG. 9 shows plasma emission intensity of the peak wavelength of 706.5 nm of helium versus pressure for the comparative examples and experimental example.

Referring to FIG. 9, at a pressure of 300 Torr as above, a plasma intensity of approximately 9 times greater than that of plasma generated with a conventional rotating electrode on which no capillary units were formed was observed.

Figure 31:
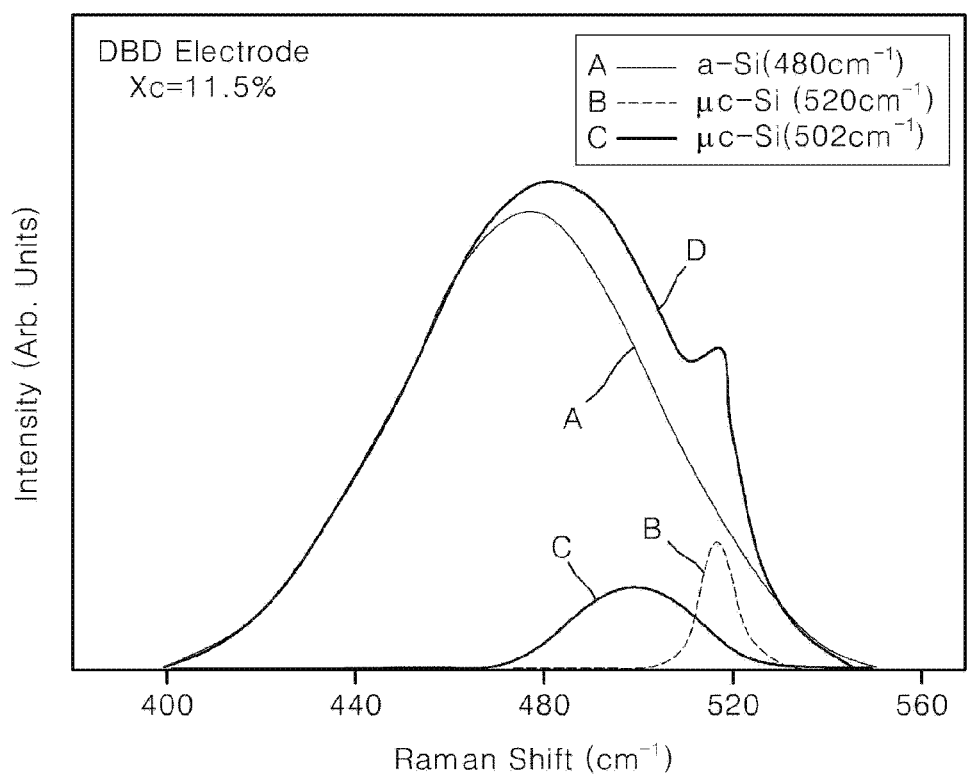
FIG. 31 is a graph showing analysis of a degree of crystallinity of a silicon thin film formed by plasma generating from a DBD electrode.
Figure 32:
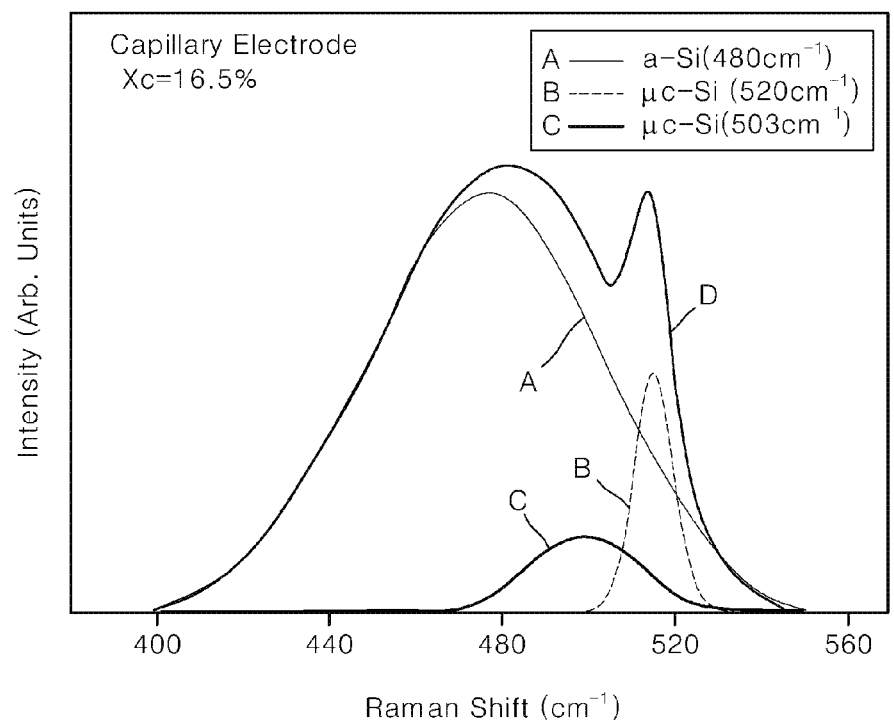
FIG. 32 is a graph showing analysis of a degree of crystallinity of a silicon thin film formed by plasma generating from a capillary electrode.

Meanwhile, FIG. 31 is a graph showing analysis of a degree of crystallinity of a silicon thin film formed by plasma generating from a DBD (dielectric barrier discharge) electrode, and FIG. 32 is a graph showing analysis of a degree of crystallinity of a silicon thin film formed by plasma generating from a capillary electrode.

Referring to FIG. 31, plasma generating from a DBD electrode was generated at a pressure of 400 Torr and with a H2/SiH4 ratio of 15, and a silicon thin film was formed at a growth rate of 0.153 nm/s with a scanning speed of 30 mm/s. Here, the degree of crystallinity was analyzed to be 11.5%. Referring to FIG. 32, however, plasma generating from a capillary electrode was generated at a pressure of 400 Torr and with a H2/SiH4 ratio of 15, and a silicon thin film was formed at a growth rate of 0.353 nm/s with a scanning speed of 30 mm/s. Here, the degree of crystallinity was analyzed to be 16.5% and confirmed a 43% improvement over that of plasma generating from a DBD electrode as above.

Manufacturing Method of a Plasma Generator Using a Capillary Discharge

Figure 10:
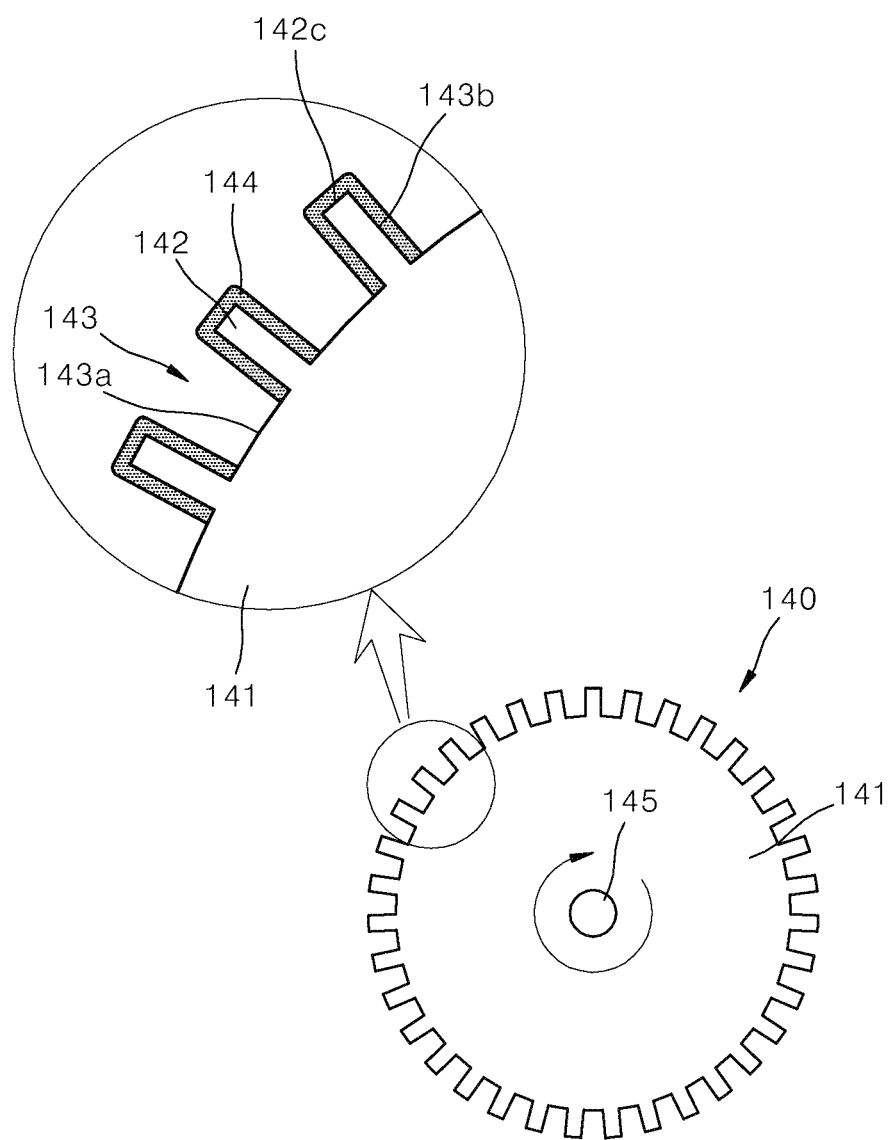
FIG. 10 is a partially enlarged schematic view of a rotating electrode shown in FIG. 1.

FIG. 10 is a partially enlarged schematic view of a rotating electrode 140 shown in FIG. 1.

Referring to FIG. 10, the rotating electrode 140 may include the electrically conductive body 141 that is connected to the rotation shaft 145.

A plurality of capillaries 143 is provided on the outer circumferential surface of the body 141. The capillaries 143 includes a space defined by a lower surface 143a and a sidewall 143b, and the space may have the shape of a trench. The shape of the space is merely illustrative and does not limit the scope of the embodiment. For example, the space defined by the lower surface 143a and the sidewall 143b may have a long and narrow shape in the form of a capillary tube. Furthermore, a cross-section that is parallel to the lower surface 143a and/or the sidewall 143b may have the shape of a circle, an ellipse, or a polygon. If a space defined by the lower surface 143a and the sidewall 143b is understood to be a concave portion, protruding portions around the concave portion will be understood to be convex portions 142.

In this embodiment, the convex portions 142 are depicted as being integrally formed with the body 141. For example, the capillary units 143 can be formed by etching the outer circumferential surface of the body 141 to form a concave-convex pattern, and the concave-convex pattern can be eventually defined by the concave and convex portions. In a modified embodiment of this embodiment, a separate pattern may be formed to be the convex portions 142 on the body 141. Here, the convex portions 142 and the body 141 may be made of identical substances or different substances. The convex portions 142 formed on the body 141 may have various shapes, e.g., a triangular, a polygonal and a rounded shapes, etc.

An insulation shield layer 144 may be disposed on the outer circumferential surface of the body 141 so that at least the lower surface 143a of the capillary units 143 is exposed. For example, the shield layer 144 may expose the lower surface 143a of the capillary units 143 and shield other parts of the circumferential surface of the body 141. A second example may be that side surfaces 143b of the capillary units 413 and the upper surfaces 142c of the convex portions 142 are covered with the shield layer 144. A third example may be that the shield layer 144 is formed to expose the lower surface 143a of the capillary units 143 and the lower portion of the sidewall 143b, and to cover the upper portion of the side surfaces 143b and the upper surfaces 142c of the convex portions 142. The shield layer 144 may include various dielectric layers, e.g., at least one of alumina ($Al_2O_3$), silicon carbide (SiC), silicon nitride ($Si_3N_4$), quartz ($SiO_2$), magnesium oxide (MgO) and Teflon (PTFE).

In the above structure, the capillary units 143, except the lower surface 143a, is surrounded by the shield layer 144 and therefore generation of plasma may occur in all directions (particularly, in a radial direction) from the capillary units 143 due to a concentration of electric potential. That is, as an electric field is applied to the rotating electrode 140, the electric field accumulates and intensifies on the lower surface 143a of the capillary units 143, thereby achieving the effect of capillary discharge.

The width, the height, etc. of the capillary units 143 may be controlled to control the generation of plasma. For example, an on/off control of plasma discharge can be carried out by controlling the number of revolutions of the cylindrical rotating electrode 140, the capillary units 143, and/or the shape thereof, etc. This structure may help control the generation of plasma and prevent the generation of arc, thereby stably maintaining plasma even at near atmospheric pressure.

For example, the width of the lower surface 143a of the capillary units 143 may range from 100 µm to 10 mm, and the aspect ratio of the capillary units 143 may range from about 0.1 to about 200. The aspect ratio of the capillary units 143 represents the ratio of the height of the side surface 143b to the width of the lower surface 143a. Meanwhile, the thickness of the shield layer 144 may range from 10 µm to 10 mm. If the thickness of the shield layer 144 is equal to or smaller than 10 µm, a discharge effects are not enough and therefore arc is generated. If the thickness of the shield layer 144 is equal to or greater than 10 mm, strong discharge effects are achieved but the discharge inception and sustain voltages may become too high.

According to the above described plasma generator, the generation of plasma is controlled and therefore the plasma can be maintained at near atmospheric pressure. The plasma may be used to deposit a thin film on the substrate 130 or etch a thin film.

Figure 11:
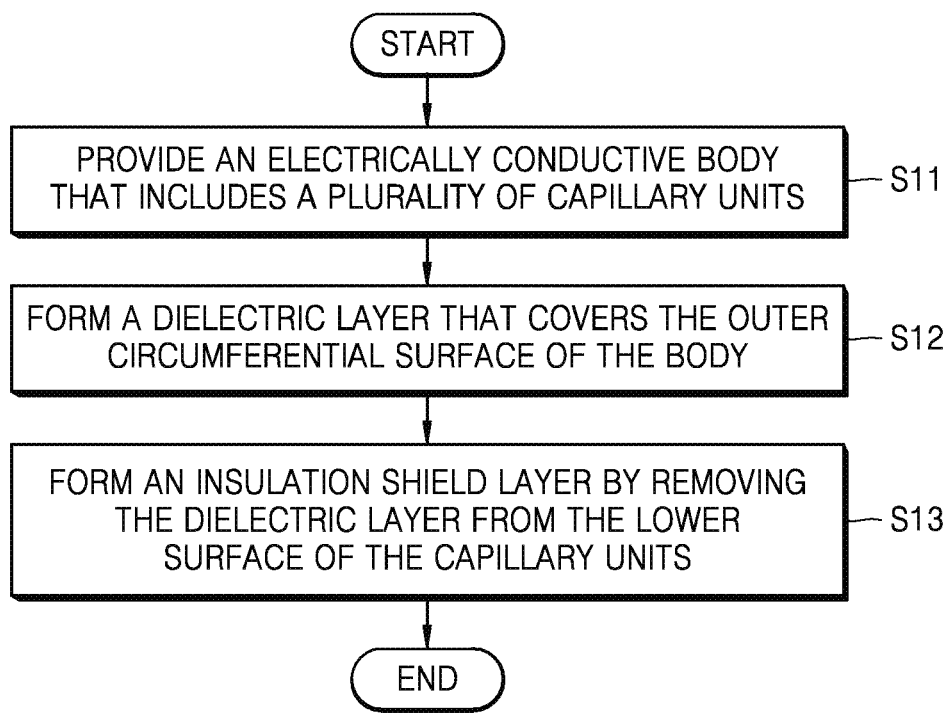
FIG. 11 is a flow chart showing a method for manufacturing a rotating electrode according to an embodiment of the present invention.
Figure 12:
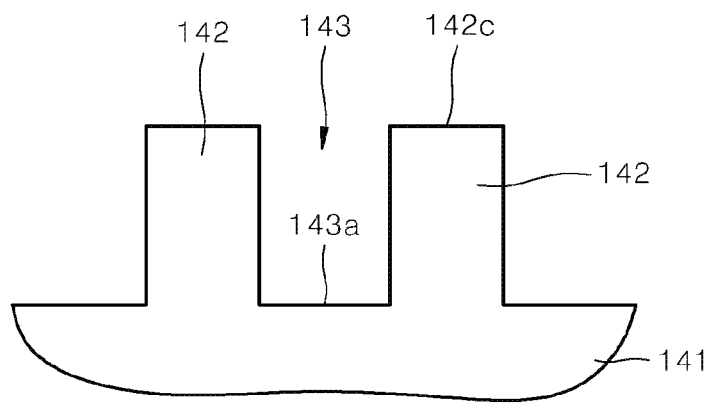
FIG. 12 is a cross-sectional view illustrating sequentially a manufacturing process of a rotating electrode according to an embodiment of the present invention.
Figure 12:
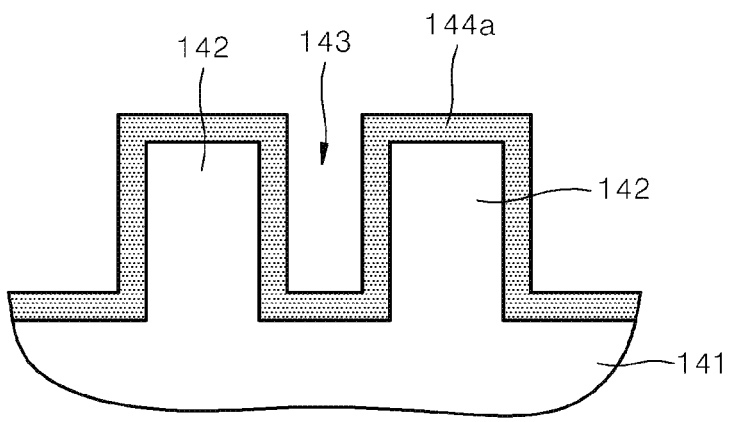
Figure 12:
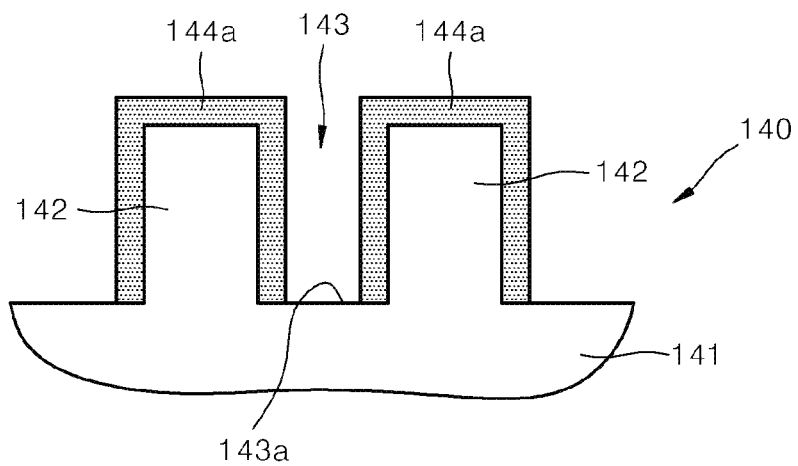

FIG. 11 is a flow chart showing a method for manufacturing a rotating electrode according to an embodiment of the present invention, and FIG. 12 is a cross-sectional view illustrating sequentially a manufacturing process of a rotating electrode according to an embodiment of the present invention.

Referring to FIGS. 11 and 12, an electrically conductive body 141 that includes a plurality of capillary units 143 is provided (S11). The body 141 shown in (a) of FIG. 12 may include various electrically conductive materials, e.g., at least one of an electrically conductive metal, an electrically conductive ceramic, an electrically conductive carbon body, and an electrically conductive polymer. The body 141 may be manufactured to include a concave and convex pattern on the outer circumferential surface thereof. For example, a portion of the body 141 may be removed so that the lower surface 143a of the capillary units 143 is exposed. Here, the electrically conductive metal refers to a metal through which electric currents flow and that can be used as an electrode, and may include aluminum or aluminum alloy, etc.

Then, as shown in (b) of FIG. 12, an insulating dielectric layer 144a is formed to cover the outer circumferential surface of the body 141 (S12). The dielectric layer 144a may include various dielectric materials including oxides. For example, the dielectric layer 144a may include at least one of alumina ($Al_2O_3$), silicon carbide (SiC), silicon nitride ($Si_3N_4$), quartz ($SiO_2$), magnesium oxide (MgO) and Teflon (PTFE).

Various methods can be used to form the dielectric layer 144a and may include anodizing, spray coating, or thin film deposition methods, etc. For example, an anodic oxidation method can be used to form an alumina ($Al_2O_3$) dielectric layer 144a if the body 141 is made of aluminum or aluminum alloy that is an electrically conductive metal. A second example may be that a thin film deposition method can be used to form a dielectric layer that is made of quartz ($SiO_2$) or magnesium oxide (MgO). The thin film deposition method may include physical vapor deposition (PVD) and chemical vapor deposition (CVD).

Selectively, an alumina ($Al_2O_3$) dielectric layer can be formed on a material other than aluminum. An aluminum or aluminum alloy can be deposited on the electrically conductive body 141 using a thin film deposition method, and then the aluminum or aluminum alloy can be oxidized to form the dielectric layer 144a by an anodic oxidation method.

For example, the body 141 shown in (a) of FIG. 12 can be embodied by forming a concave and convex pattern directly on a cylindrical structure that is made of an electrically conductive material other than aluminum, so that the lower surface 143a of the capillary units 143 appear. A dielectric layer made of aluminum can be deposited using PVD or CVD on the outer circumferential surface of the body 141 that is made of an electrically conductive material other than aluminum and formed as described above. Furthermore, an alumina ($Al_2O_3$) dielectric layer 144a can be formed by performing an anodic oxidation method such as anodizing on the dielectric layer made of aluminum, so that a phase transformation occurs. Meanwhile, in a modified embodiment, without using an anodic oxidation method, a dielectric layer 144a made of alumina ($Al_2O_3$) can be directly deposited using PVD or CVD on the outer circumferential surface of the body that is made of an electrically conductive material other than aluminum.

Then, as shown in (c) of FIG. 12, the dielectric layer 144a on at least the lower surface of the capillary units 143 is selectively removed so that the insulation shield layer 144 is formed (S13). For example, at least the lower surface 143a of the capillary units 143 is selectively removed and the insulation shield layer 144 that exposes the lower surface 143a of the capillary units 143 on the outer circumferential surface of the body 141 can be formed.

For example, the dielectric layer 144a can be removed so that the lower surface 143a of the capillary units 143 is completely exposed, and therefore the shield layer 144 can be formed to cover the sidewall 143b of the capillary units 143 and the upper surfaces 142c of the convex portions 142. A second example may be that part of the dielectric layer 144a on the lower surface 143a of the capillary units 143 is removed so that the shield layer 144 is formed to expose at least part of the lower surface 143a of the capillary unit 143.

Methods for removing the dielectric layer 144a to expose the lower surface 143a of the capillary units 143 may include, for example, a diamond cutting method or a laser cutting method, etc., and various methods can be used unless the capillary units 143 of the rotating electrode 140 are damaged. For example, to selectively remove the dielectric layer 144a, wet etching or plasma etching is performed after a proper masking process.

Meanwhile, in a modified embodiment of this embodiment, an electrically conductive material (not shown) may be additionally formed on the lower surface 143a of the capillary units 143 after the dielectric layer 144a is formed as shown in (b) of FIG. 12. Here, the shield layer may be the remaining part of the dielectric layer 144a exposed by the electrically conductive material.

Figure 13:
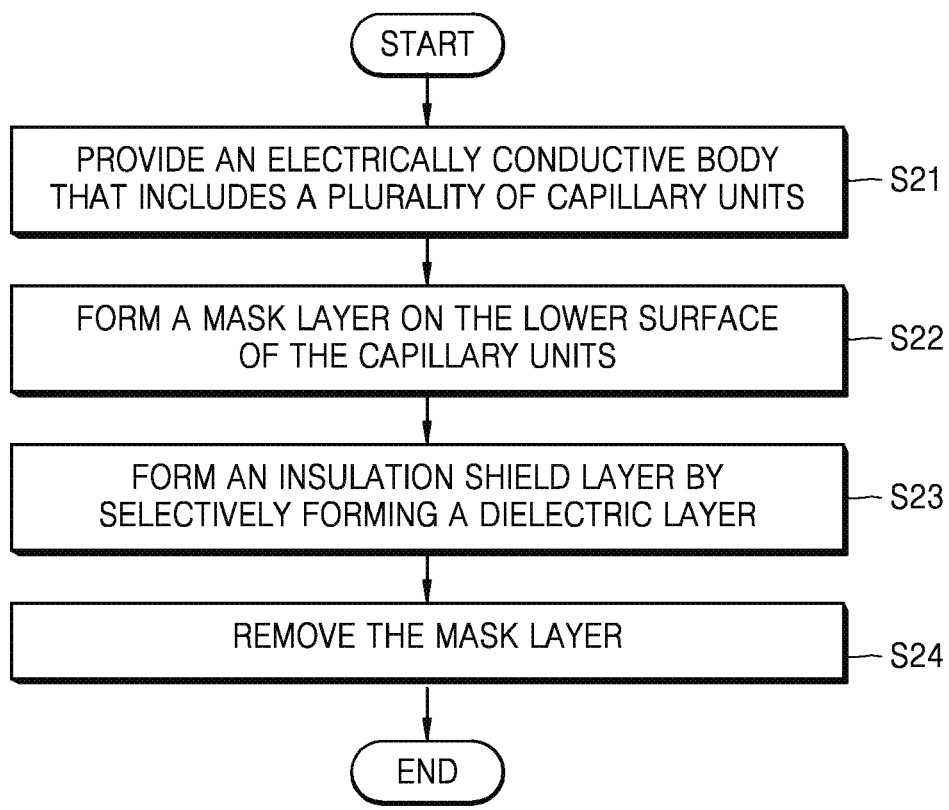
FIG. 13 is a flow chart showing a method for manufacturing a rotating electrode according to another embodiment of the present invention.
Figure 14:
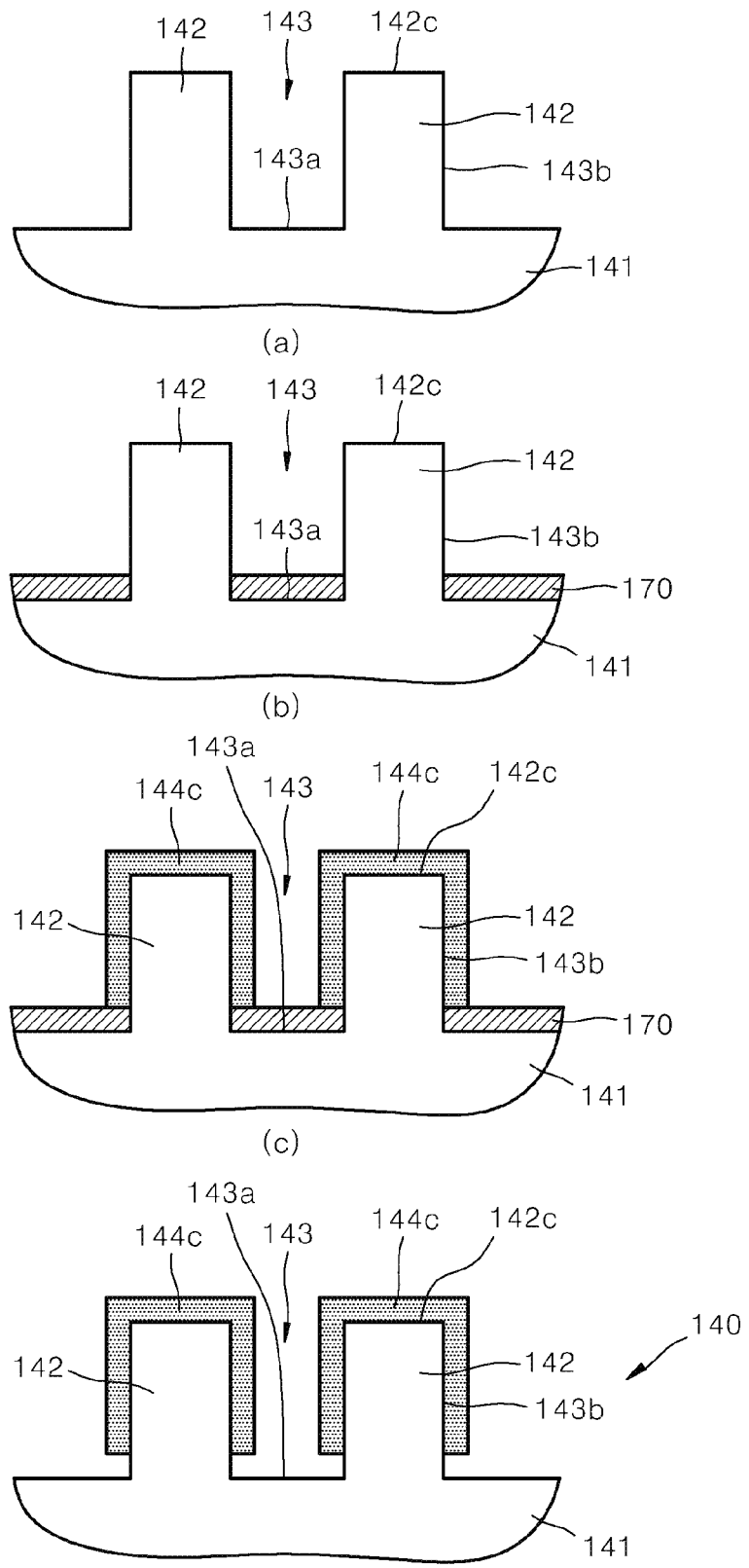
FIG. 14 is a cross-sectional view illustrating sequentially a manufacturing process of a rotating electrode according to another embodiment of the present invention.

FIG. 13 shows a flow chart illustrating a method for manufacturing a rotating electrode according to another embodiment of the present invention, and FIG. 14 is a cross-sectional view illustrating sequentially a manufacturing process of a rotating electrode according to another embodiment of the present invention. A manufacturing method of a rotating electrode according to this embodiment is a method that has modified a few of the processes of the manufacturing method of a rotating electrode shown in FIGS. 11 and 12, and therefore overlapping explanations between the two embodiments will be omitted.

Referring to FIGS. 13 and 14, an electrically conductive body 141 that includes a plurality of capillary units 143 is provided (S21). Explanations with regard to FIG. 12 can be referred to for the step (21) of providing the body 141.

Then, a mask layer 170 is formed on the lower surface 143a of the capillary units 143 (S22). For example, the mask layer 170 may be made of a material that has etch selectivity with the dielectric layer 144c that is formed by anodic oxidation. For example, the mask layer 170 may be made of a material such as resist, glass, polyimide, etc.

The mask layer 170 may be formed by various methods. For example, the mask layer 170 may be formed by dropping a liquid or sol-gel insulating material on the capillary units 143 with the body 141 rotating so that the insulating material remains only on the lower surface 143a of the capillary units 143 while the insulating material on the convex portions 142 of the body 141 flies away due to the centrifugal force. A second example may be that after an insulating material that is planarized so that the spaces of the capillary units 143 are filled is formed, by blanket etching the insulating material so that the insulating material remains only on the lower surface 143a of the capillary units 143, the mask layer 170 may be formed. For example, if a spin-on-glass (SOG) insulating material is applied on the body 141, a planarized insulating material that substantially fills the spaces of the capillary units 143 can be formed, and the mask layer 170 can be formed by etching a predetermined amount of the insulating material.

Then, the dielectric layer 144c can be selectively formed on the outer circumferential surface, which is exposed from the mask layer 170, of the body 141 (S23). Substantially, the dielectric layer 144c is formed to expose the lower surface 143a of the capillary units 143, and therefore the dielectric layer can be a shield layer.

For example, the dielectric layer 144c can be selectively formed by oxidizing the outer circumferential surface of the body 141, except the part in which the mask layer 170 is formed on the lower surface 143a of the capillary units, using an anodic oxidation method. Here, since the mask layer 170 covers the lower surface 143a of the capillary units 143, anodic oxidation of the lower surface 143a of the capillary units 143 is prevented and therefore the dielectric layer 144c is not formed thereon.

Meanwhile, if the surface of the body 141 is not an aluminum material, an alumina ($Al_2O_3$) dielectric layer can be formed by using an anodic oxidation method after depositing aluminum and aluminum alloys on the surface of the body 141.

For example, the body 141 shown in (a) of FIG. 14 can be embodied by forming a concave and convex pattern directly on a cylindrical structure that is made of an electrically conductive material other than aluminum, so that the lower surface 143a of the capillary units 143 appear. The mask layer 140 is formed on the surface 143a of the capillary units 143 of the body 141 that is made of an electrically conductive material other than aluminum and formed as above. The mask layer 170 may be made of a material that has etch selectivity with the dielectric layer 144c that is formed by anodic oxidation. After forming the mask layer 170, a dielectric layer made of aluminum can be selectively deposited using PVD or CVD on the outer circumferential surface, which is exposed from the mask layer 170, of the body 141 that is made of an electrically conductive material other than aluminum. Furthermore, an alumina ($Al_2O_3$) dielectric layer 144a can be formed by performing an anodic oxidation method such as anodizing on the dielectric layer made of aluminum, so that a phase transformation occurs. Meanwhile, in a modified embodiment, without using an anodic oxidation method, a dielectric layer 144c made of alumina ($Al_2O_3$) can be directly deposited using PVD or CVD on the outer circumferential surface, which is exposed from the mask layer 170, of the body that is made of an electrically conductive material other than aluminum. Here, since the mask layer 170 covers the lower surface 143a of the capillary units 143, anodic oxidation of the lower surface 143a of the capillary units 143 is prevented and therefore the dielectric layer 144c is not formed thereon.

Then, the mask layer 170 is removed (S24). For example, wet etching or plasma etching may be used to remove the mask layer 170.

Figure 15:
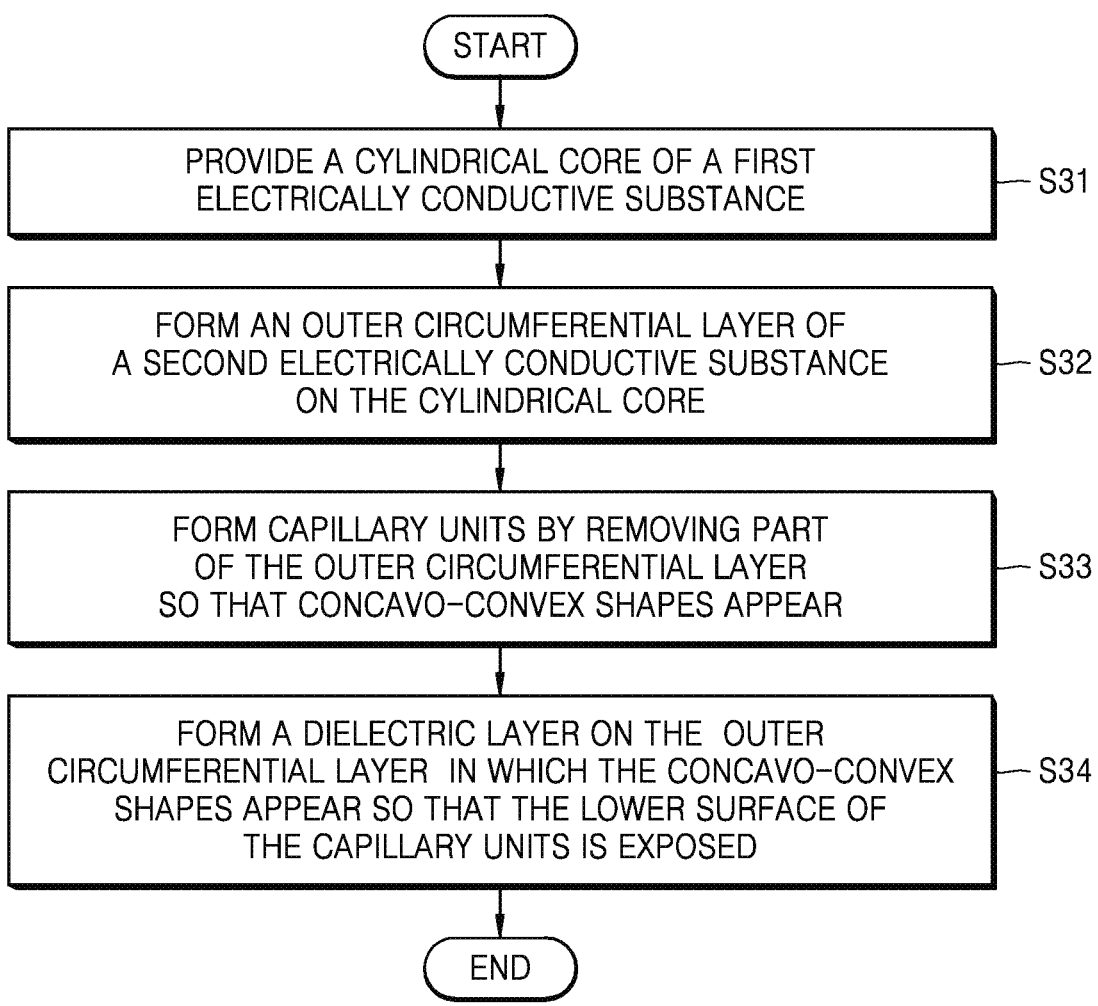
FIG. 15 is a flow chart showing a method for manufacturing a rotating electrode according to yet another embodiment of the present invention.
Figure 16:
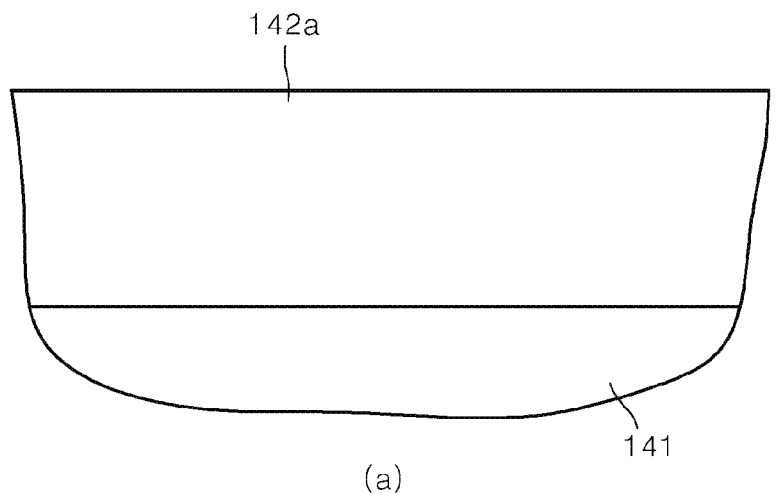
FIG. 16 is a cross-sectional view illustrating sequentially a method for manufacturing a rotating electrode according to yet another embodiment of the present invention.
Figure 16:
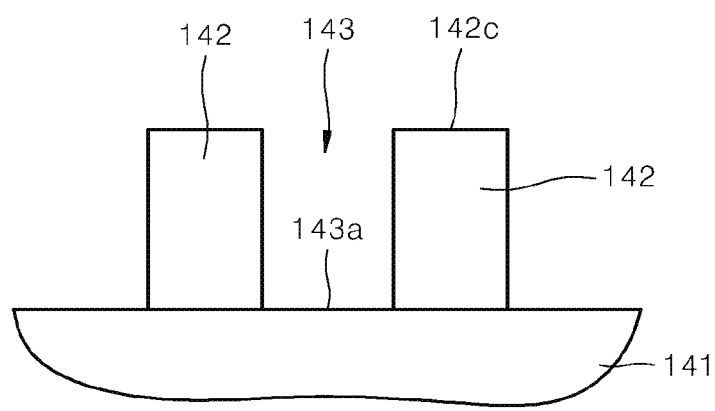
Figure 16:
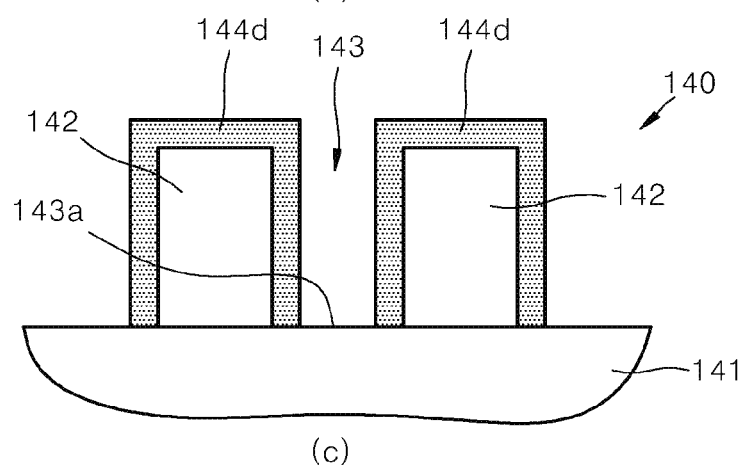
Figure 17:
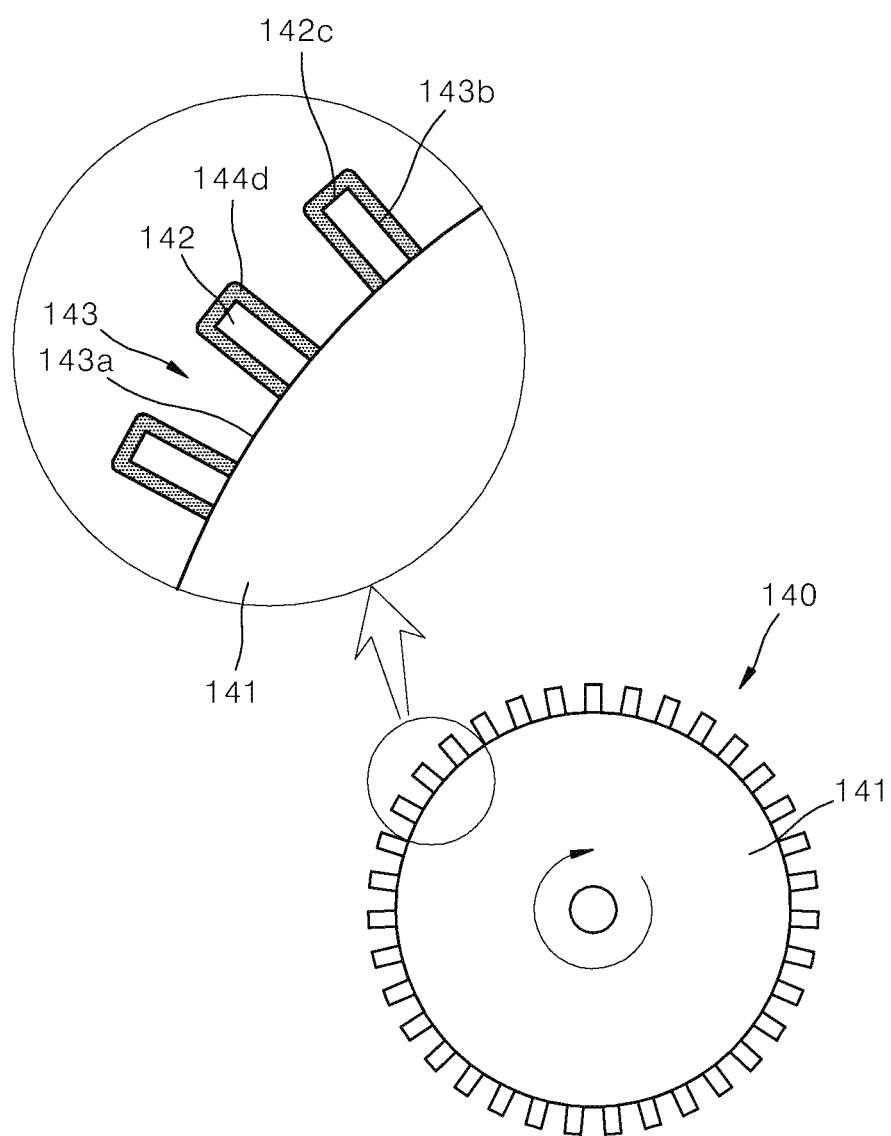
FIG. 17 is a partially enlarged schematic view of a rotating electrode manufactured according to yet another embodiment of the present invention.

FIG. 15 shows a flow chart illustrating a method for manufacturing a rotating electrode according to yet another embodiment of the present invention, FIG. 16 is a cross-sectional view illustrating sequentially a method for manufacturing a rotating electrode according to yet another embodiment of the present invention, and FIG. 17 is a partially enlarged schematic view of a rotating electrode manufactured according to yet another embodiment of the present invention.

Referring to FIGS. 15-17, to provide an electrically conductive body 141 that includes a plurality of capillary units, a step (S31) of providing a cylindrical core 141 that includes a first electrically conductive substance, a step (S32) of forming an outer circumferential layer 142a that includes a second electrically conductive substance on the outer circumferential surface of the cylindrical core 141, and a step (S33) of forming a plurality of capillary units 143 by removing part of the outer circumferential layer 142a so that the cylindrical core 141 is exposed and concave-convex shapes appear, may be sequentially carried out.

In the above embodiments that have been explained with regard to FIGS. 11-14, since convex portions 142 are formed by etching part of the body 141, the body 141 and the convex portions 142 are made of identical substances and integrally formed. On the other hand, in this embodiment that is explained with regard to FIGS. 15 and 16, the convex portions 142 are formed not by etching part of the cylindrical core 141 but by removing part of the outer circumferential layer 142a that is formed separately on the outer circumferential surface of the cylindrical core 141. Therefore, the convex portions 142 and the cylindrical core 141 are neither necessarily made of identical substances nor integrally formed.

In the step (S32) of forming the outer circumferential layer 142a that includes a second electrically conductive substance on the outer circumferential surface of the cylindrical core 141, the method for forming the outer circumferential layer 142a on the outer circumferential surface of the cylindrical core 141 may include deposition methods such as physical vapor deposition (PVD), chemical vapor deposition (CVD), or atomic layer deposition (ALD). Furthermore, the method for forming the outer circumferential layer 142a on the outer circumferential surface of the cylindrical core 141 may include plating techniques such as electroplating, electroless plating, etc. Furthermore, the method for forming the outer circumferential layer 142a on the outer circumferential surface of the cylindrical core 141 may include spray coating or hot dipping.

In the step (S33) of forming a plurality of capillary units 143 by removing part of the outer circumferential layer 142a so that the cylindrical core 141 is exposed and concave-convex shapes appear, the method for removing part of the outer circumferential layer 142a may include, for example, a diamond cutting method or a laser cutting method, etc. The capillary units 143 include a space defined by a lower surface 143a and a sidewall 143b, and the space may have the shape of a trench. The shape of the space is merely illustrative and does not limit the scope of the embodiment. For example, the space defined by the lower surface 143a and the sidewall 143b may have a long and narrow shape in the form of a capillary tube. Furthermore, a cross-section that is parallel to the lower surface 143a and/or the sidewall 143b may have the shape of a circle, an ellipse, or a polygon. If a space defined by the lower surface 143a and the sidewall 143b is understood to be a concave portion, protruding portions around the concave portion will be understood to be convex portions 142.

Furthermore, the step (S34) of forming an insulation shield layer 144d may include a step of forming a dielectric layer 144d on the outer circumferential layer 142a in which concave-convex shapes appear so that at least part of the lower surface 143a of the capillary units 143 is exposed. The inventor, took notice of the fact that the cylindrical core 141 that includes a first electrically conductive substance and the convex portions 142 that include a second electrically conductive substance are made of different substances, and simply formed the insulation shield layer 144d by using a process in which the dielectric layer 144d is selectively formed only on the surfaces 142c and 143b of the convex portions 142.

The method of selectively forming the dielectric layer 144d only on the surfaces 142c and 143d of the convex portions 142 without forming the dielectric layer 144d on the lower surface 143 of the capillary units 143 may include, for example, a method of oxidizing only the second electrically conductive substance of the first and second electrically conductive substances under certain conditions. For example, if the first electrically conductive substance that constitutes the cylindrical core 141 includes iron and the second electrically conductive substance that constitutes the convex portions 142 includes aluminum, the dielectric layer 144d that selectively includes aluminum oxide ($Al_2O_3$) only on the surfaces 142c and 143b of the convex portions 143 can be formed through anodic oxidation.

Another example of the method of selectively forming the dielectric layer 144d only on the surfaces 142c and 143d of the convex portions 142 without forming the dielectric layer 144d on the lower surface 143 of the capillary units 143 may be a dipping method using differences in wettability. For example, the dielectric layer 144d can be formed only on the surfaces 142c and 143b of the convex portions 142 by dipping the body 141 into a solution that includes a dielectric substance, having a relatively low wettability with the first electrically conductive substance that constitutes the cylindrical core 141 and a relatively high wettability with the second electrically conductive substance that constitutes the convex portions 142.

Yet another example of the method of selectively forming the dielectric layer 144d only on the surfaces 142c and 143d of the convex portions 142 without forming the dielectric layer 144d on the lower surface 143 of the capillary units 143 may be a vapor deposition using differences in covalent bonding. For example, the dielectric layer 144d can be formed only on the surfaces 142c and 143b of the convex portions 142 through a vapor deposition using a precursor that forms a relatively strong covalent bond with the first electrically conductive substance that constitutes the cylindrical core 141 and a relatively weak covalent bond with the second electrically conductive substance that constitutes the convex portions 143.

In this embodiment, a step of forming a mask layer or etching part of the dielectric layer before or after the step of forming a dielectric layer to form an insulation shield layer 144d is unnecessary. Therefore, an advantageous effect of reducing manufacturing costs is expected since an insulation shield layer is effectively formed with the number of steps or processes being decreased.

Although the above described method for manufacturing an electrode for a plasma generator illustratively relates to a manufacturing method of a rotating electrode, the idea of the present invention is not limited to a rotating electrode. It is clear that the idea of the present invention may be applied to a manufacturing method of an electrically conductive electrode that includes capillary units, e.g., a flat plate electrode that includes capillary units.

Flat Plate Type Plasma Generator

Figure 18:
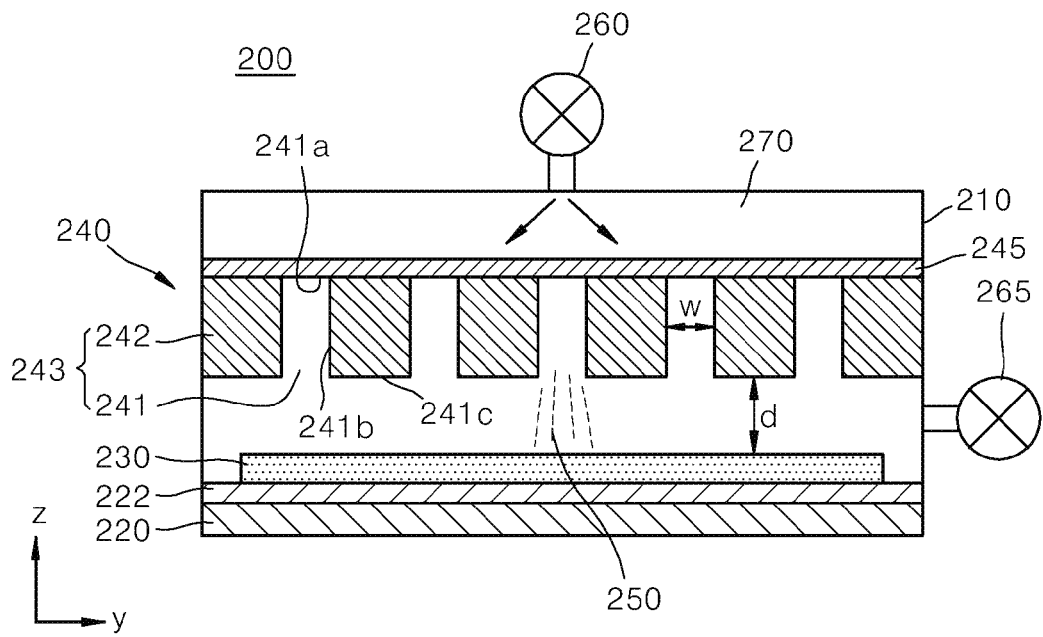
FIG. 18 is a schematic cross-sectional view of a plasma generator 200 according to an embodiment of the present invention.

FIG. 18 is a schematic cross-sectional view of a plasma generator 200 according to an embodiment of the present invention.

Referring to FIG. 18, the plasma generator 200 according an embodiment of the present invention may include a chamber 210 for defining a reaction space, a first electrode 220 within the chamber 210, a substrate 230 on the first electrode 220, and a second electrode 240 that is spaced apart from the substrate 230 by a distance d. The second electrode 240 may include a plurality of capillary units 243 that includes a body 242 that is disposed on a surface opposed to the first electrode 220 and defines a cavity 214 therebetween, an electrically conductive porous layer 245 on the lower surface 241a of the cavity 241 and a discharge gas channel 270.

Furthermore, an inlet 260, an outlet 265 and a power supply (not shown) that is electrically connected to the first electrode 220 and the second electrode 240, respectively, and generates an atmospheric-pressure plasma may be included. The power supply (not shown) may be either a DC or an AC power supply, and may supply, for example, an AC electric power having a frequency that ranges from 50 Hz to 10 GHz.

The inlet 260 for injecting discharge gases into the chamber 210 may be provided at one side of the chamber, and the outlet 265 for emitting discharge gases within the chamber to the outside may be provided at the other side of the chamber 210. The shape of the chamber 210 is merely illustrative and does not limit the scope of this embodiment. For example, the chamber 210 may be provided having the shape of a polygon as shown in FIG. 18, or a circle or dome.

The inlet 260 is connected to a discharge gas supplier (not shown), and a gas flow meter to control flow may be connected between the inlet 260 and the discharge gas supplier. Selectively, the outlet 265 may be connected to a pump (not shown) to easily discharge gases or other gas within the chamber 210 to the outside. The pump, however, may be omitted if the chamber 210 operates at atmospheric pressure. The shapes and arrangements of the inlet 260 and the outlet 265 may be properly adjusted and do not limit the scope of this embodiment.

The first electrode 220 is provided in the chamber 210 so that the substrate 210 is seated. The first electrode 220 may provided in the shape of a plate and include a heater to heat the substrate 230. For example, the plate-shaped lower electrode 220 may be provided having a hot plate with a heater installed therein. A dielectric layer 222 may be disposed between the substrate 230 and the first electrode 220. The substrate 130 may be provided variously. For example, the substrate 13 may be provided having a semiconductor wafer such as silicon to manufacture semiconductor devices, or may be provided having a glass substrate or plastic substrate to manufacture display devices or solar cells.

Meanwhile, a stage on which the first electrode 220 can be mounted may be provided, and the stage may move the first electrode along the positive or negative direction of y-axis and therefore perform an atmospheric plasma treatment of the substrate 230 that is larger than the second electrode 240. Furthermore, the stage may move along the positive or negative direction of z-axis and therefore induce insulation breakdown for generation of plasma by regulating the distance d between the substrate 230 and the second electrode 240. A second example may be that the first electrode 210 is fixed and the second electrode may move along the positive or negative direction of y-axis.

The second electrode 240 that is spaced apart by a distance d from the substrate 230 may be provided. Here, the second electrode 240 may be provided opposed to the first electrode 220, and may be in the shape of a plate, including a plurality of capillary units 243 that define the cavity 241 and the electrically conductive porous layer 245 on the lower surface 241a of the cavity. The lower surface 241a of the cavity may correspond to part of a surface of the electrically conductive porous layer 245, which is opposed to the lower surface 241a, and the body 242 may comprise various insulating materials. For example, the body may include at least one of alumina ($Al_2O_3$), silicon carbide (SiC), silicon nitride ($Si_3N_4$), quartz ($SiO_2$), magnesium oxide (MgO) and Teflon (PTFE).

The cavity is limited by a body 242 and another body 242 that is spaced apart from the body 242 and includes a space that is defined by the lower surface 241a and the side surface 241b. The space may be in the shape of a trench, and be referred to as a capillary cavity. The shape of the space is merely illustrative and does not limit the scope of this embodiment. For example, the space defined by the lower surface 241a and the side surface 241b may have a long and narrow shape in the form of a capillary tube. Furthermore, a cross-section that is parallel to the lower surface 241a of the cavity may have a concave pattern in the shape of a circle, an ellipse, or a polygon.

The capillary cavity 241 limited by the body may be regularly arranged with a constant spacing. The width of the lower surface 241a of the cavity may have a predetermined value, e.g., ranging from 200 μm to 10 mm, and the aspect ratio of the plurality of the capillary units may range from 1 to 200. The aspect ratio of the plurality of the capillary units represents the ratio of the height of the side surface 241b to the width of the lower surface 241a.

The electrically conductive porous layer 245 may include a plurality of micropores (not shown) that extends from a surface opposed to the lower surface 241a of the cavity to the lower surface 241a of the cavity, so that reaction gases that sequentially flow in through the discharge gas inlet 260 and the discharge gas channel 270 are directly supplied into the cavity 241. The surface opposed to the lower surface 241a of the cavity, described herein, is the surface of the electrically conductive porous layer 245 that is exposed to the discharge gas channel 270. The sizes of the plurality of micropores may correspond to ASTM No 5 to 400. Furthermore, the electrically conductive porous layer 245 may include various electrically conductive substances, e.g., at least one of an electrically conductive metal, an electrically conductive ceramic, an electrically conductive carbon body, and an electrically conductive polymer.

In the above structure, areas other than the lower surface 214a of the cavity, are blocked by the insulating body 242 and therefore generation of the plasma 250 may occur in all directions (particularly, in a radial direction) from the second electrode 240 that includes the capillary units 143 due to a concentration of electric potential. That is, as an electric field is applied to the second electrode 240, the electric field concentrates and intensifies on the lower surface 241a of the cavity, thereby achieving the effect of capillary discharge.

Furthermore, since the discharge gases are directly supplied through the electrically conductive porous layer 245 that includes a plurality of the micropores that extends from the lower surface 241a of the cavity to a surface of the electrically conductive porous layer 245 that is opposed to the lower surface 241a, a stable glow discharge can be induced, thereby achieving a high density atmospheric-pressure plasma.

Figure 19:
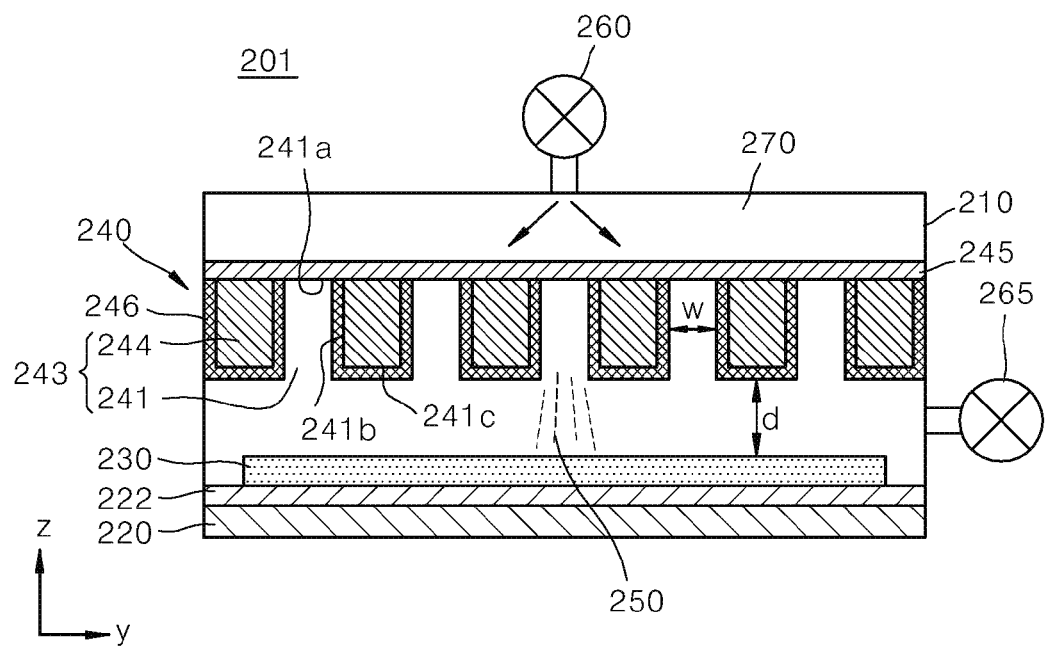
FIG. 19 is a schematic cross-sectional view of a plasma generator 201 according to another embodiment of the present invention.

FIG. 19 is a schematic cross-sectional view of a plasma generator 201 according to another embodiment of the present invention.

Referring to FIG. 19, a body 244 that includes a plurality of capillary units is an electrically conductive material. Additionally, an insulation layer 246 that shields the body 244 may be formed on the side surface 241b and the upper surface 241c of the capillary units. Since elements other than the body 244 and the insulation layer 246 shown in FIG. 19 are the same as those shown in FIG. 18, overlapping explanations thereof will be omitted.

The second electrode 240 may include a body 244 that comprises the electrically conductive porous layer 245 and the electrically conductive material. Meanwhile, since a concentration of electric potential does not easily occur from the lower surface 241a of the cavity if the body that includes the capillary units is made of an electrically conductive material, the insulation layer 246 that shields the side surface 241b and the upper surface 241c is additionally formed so that an electric potential can concentrate on the lower surface 241a of the cavity when the electric potential is applied to the second electrode.

The above described insulation layer 246 may comprise various insulating materials. For example, the insulation layer may include at least one of alumina ($Al_2O_3$), silicon carbide (SiC), silicon nitride ($Si_3N_4$), quartz ($SiO_2$), magnesium oxide (MgO) and Teflon (PTFE).

The thickness of the insulation layer 246 may, for example, range from 10 µm to 10 mm. If the thickness of the insulation layer 246 is equal to or smaller than 10 µm, discharge effects are not enough and therefore arc is generated. If the thickness of the insulation layer 246 is equal to or greater than 10 mm, strong discharge effects are achieved but the discharge inception and sustain voltages may become too high.

Meanwhile, since reaction gases are injected only through the lower surface 241a of the cavity, the body 244 in this embodiment does not necessarily include micropores like the electrically conductive porous layer 245 and may include various materials such as electrically conductive metals, alloys, electrically conductive polymers, etc. However, since the insulation layer surrounds the side surface 241b and the upper surface 241c that are exterior parts of the capillary units 243 except the lower surface 241a, reaction gases injected through the discharge gas inlet 260 are not leaked to the side surface 241b and the upper surface 241c of the capillary units and therefore materials such as the electrically conductive porous layer 245 can be used to manufacture the body 244 for simplifying the manufacturing process.

According to the above described structure, since the discharge gases are directly supplied through the electrically conductive porous layer 245, a stable glow discharge can be induced, thereby achieving a high density atmospheric-pressure plasma. Furthermore, transitions into arc discharge can be prevented and a concentration of electric potential occurs only on the lower surface 241a of the cavity, thereby achieving a high density atmospheric-pressure plasma.

Figure 20:
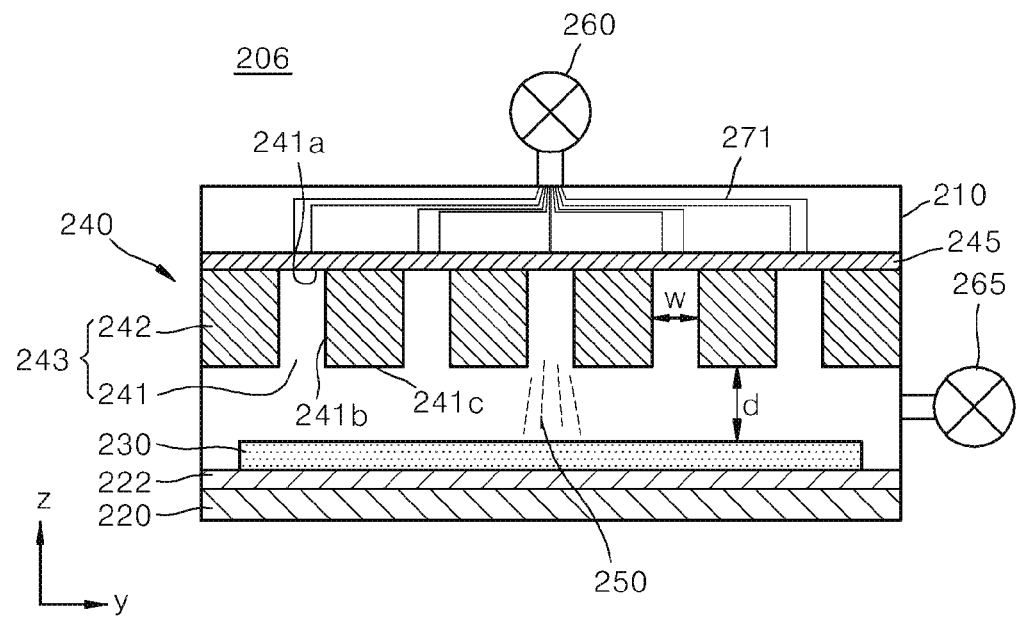
FIG. 20 is a schematic cross-sectional view of a plasma generator 206 according to yet another embodiment of the present invention.

FIG. 20 is a schematic cross-sectional view of a plasma generator 206 according to yet another embodiment of the present invention.

Referring to FIG. 20, a discharge channel 271 that supplies discharge gases from the discharge gas inlet 260 to the electrically conductive porous layer 245 includes a plurality of microchannels that are arranged to directly correspond to the lower surfaces 241a of the plurality of cavities. While the discharge gas channel 270 shown in FIGS. 18 and 19 is connected to the whole part of a surface of the electrically conductive porous layer 245, the discharge gas channel 270 shown in FIG. 20 can be directly connected by the plurality of microchannels to only part of a surface of the electrically conductive porous layer 245 that corresponds to the lower surfaces 241a of the plurality of cavities.

Therefore, the second electrode 240 includes a plurality of capillary units 243 that includes a body 242, an electrically conductive porous layer 245 on the lower surface 241a of the cavity 241, and a discharge gas channel 271. The plurality of capillary units 243 includes bodies 242 that are formed on a surface opposed to the first electrode 220 and limit the cavity 241 therebetween.

Since elements other than the discharge gas channel 271 shown in FIG. 20 are the same as those shown in FIG. 18, overlapping explanations thereof will be omitted.

According to this embodiment, since the discharge gases are directly supplied from the discharge gas inlet 260 to the lower surface 241a of the cavity, an atmospheric-pressure plasma can be stably generated. Furthermore, since the injected reaction gases are emitted into the chamber 210 in which the substrate 230 is seated, only through the lower surface 241a of the cavity and the electrically conductive porous layer 245, the amount of plasma discharge can be increased and a high density plasma can be generated.

Plasma treatments of the substrate 230 can be performed using the above described embodiments. First, the substrate 230 may be seated on the first electrode 220. Then, discharge gases may be supplied onto the substrate 230 within the chamber 210, by injecting the discharge gases into the cavity 241 of the plurality of the capillary units 243 through the electrically conductive porous layer 245. Plasma can be generated between the first electrode 220 and the second electrode 240 after the discharge gases are supplied. According to the above described plasma generators, the generation of plasma is controlled and therefore the plasma can be maintained at near atmospheric pressure. The plasma may be used to deposit a thin film on the substrate 230 or etch a thin film.

Figure 21:
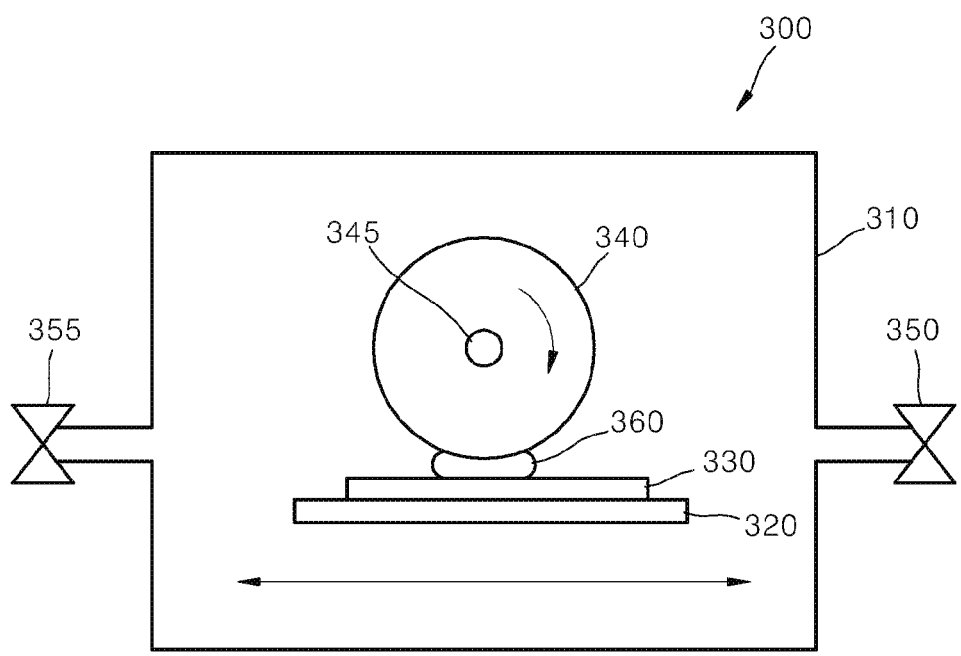
FIG. 21 is a schematic cross-sectional view of a plasma CVD device according to an embodiment of the present invention.
Figure 22:
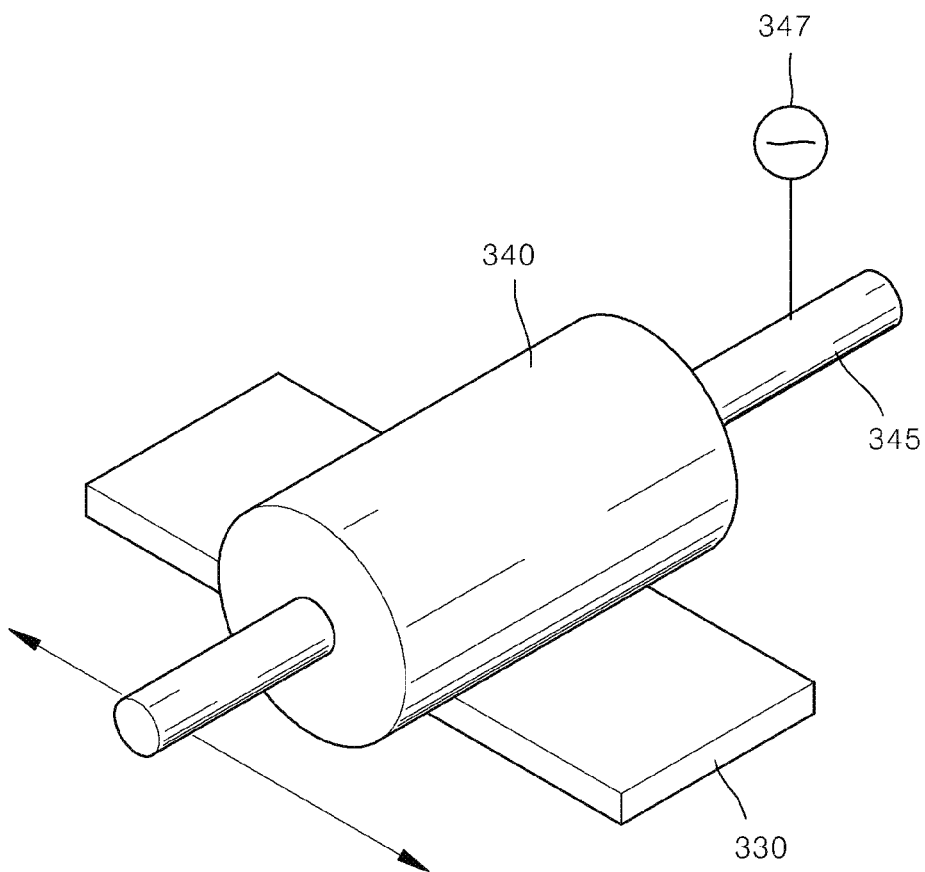
FIG. 22 is a schematic perspective view of the plasma CVD device of FIG. 21, showing the arrangement of a rotating electrode and a substrate.

Method for Forming a Crystalline/Non-Crystalline Thin Film Using Atmospheric-Pressure Plasma FIG. 21 is a schematic cross-sectional view of a plasma CVD device 300 according to an embodiment of the present invention. FIG. 22 is a schematic perspective view of the plasma CVD device 300 of FIG. 21, showing the arrangement of a rotating electrode and a substrate.

Referring to FIGS. 21 and 22, a chamber 310 for defining a reaction space is provided. An injection valve 350 for injecting reaction gases into the chamber 310 may be positioned at one side of the chamber 310, and an exhaust valve 355 for emitting reaction gases in the chamber 310 to the outside may be positioned at the other side of the chamber 310. The shape of the chamber 310 is merely illustrative and does not limit the scope of this embodiment. For example, the chamber 310 may be provided having the shape of a polygon as shown in FIG. 21, or a circle or dome.

The injection valve 350 is connected to a gas supplier (not shown), and a gas flow meter to control a flow rate may be connected between the injection valve 350 and the gas supplier. Selectively, the exhaust valve 355 may be connected to a pump (not shown) to easily discharge reaction gases or other gas to the outside. The pump, however, may be omitted if the chamber 310 operates at atmospheric pressure. The shapes and arrangements of the injection valve 350 and the exhaust valve 355 may be properly adjusted and do not limit the scope of this embodiment.

The substrate 330 on which a thin film is formed may be provided within the chamber and seated on the support plate 320. The substrate 330 may be manually transferred into the chamber 310 and individually seated on the support plate 320, or may be continuously transferred into the chamber 310 by automated transfer means. For example, the substrate 330 may be seated on the support plate 320 on a sheet-by-sheet basis by using a robot system, or may be continuously transferred into the chamber 310 by using a conveyor belt. A load/unload gate may be arranged in a part of the chamber to load/unload the substrate 330.

The support plate 320 may be connected to a driving unit (not shown) to move the substrate 330. Furthermore, the support plate 320 may include a heating unit to heat the substrate 330. For example, the support plate 320 may be provided having a hot plate with a heater installed therein. The substrate 330 may be provided variously, depending on a type of thin films that will be formed on the substrate. For example, the substrate 330 may be provided having a semiconductor wafer such as silicon to manufacture semiconductor devices, or may be provided having a glass substrate or plastic substrate to manufacture display devices or solar cells.

A rotating electrode 340 may be provided on the support plate 320 so that the rotating electrode 340 and the substrate 330 face each other. For example, the rotating electrode 340 may be provided having a rotation shaft 345 at the center so that the rotating electrode 340 is rotatable. The rotation shaft 345 may be connected to a driving unit (not shown) to receive a driving force. The rotating electrode 340 may be connected to a power supply unit 347 to be provided with electricity, and, for example, the rotation shaft 345 may be connected to the power supply unit 347. For example, the power supply unit 347 may be an AC power supply that is capable of providing a high frequency electricity. The rotation shaft 345 may be arranged transversely to a direction the substrate 330 moves, and, for example, may extend perpendicularly to the direction the substrate 330 moves.

Therefore, when reaction gases flow through the injection valve 350 into the chamber 310 and electric power is supplied to the rotating electrode 340, plasma 360 can be first generated between the rotating electrode 340 and the substrate 330. The plasma 360 may induce chemical reactions by activating the reaction gases. To control the generation of the plasma 360, a gap between the rotating electrode 340 and the substrate 330 may need to be properly controlled, e.g., in a range of 0.1 mm to 1 mm. Meanwhile, inert gases together with the reaction gases may be injected into the chamber 310 to control or dilute the atmosphere in the chamber 310.

A thin film may be formed on the substrate 330 by the above described chemical reactions. However, since the plasma 360 is generated at local regions, it is necessary that the substrate 330 or the rotating electrode 340 is relatively moved to form a thin film all over the substrate 330. For example, the substrate 330 may be moved along at least one direction with the rotation electrode 340 fixed, thereby scanning the substrate 330.

Hereinafter, a method for forming a thin film using the above described plasma CVD device 300 will be explained in more detail.

Figure 23:
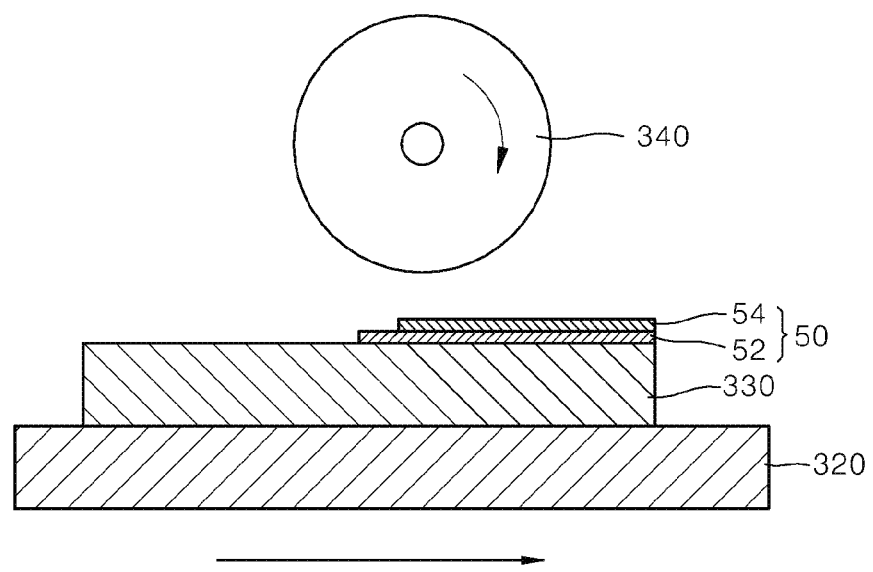
FIG. 23 is a schematic cross-sectional view of a method for forming a thin film using a plasma CVD device according to an embodiment of the present invention.
Figure 24:
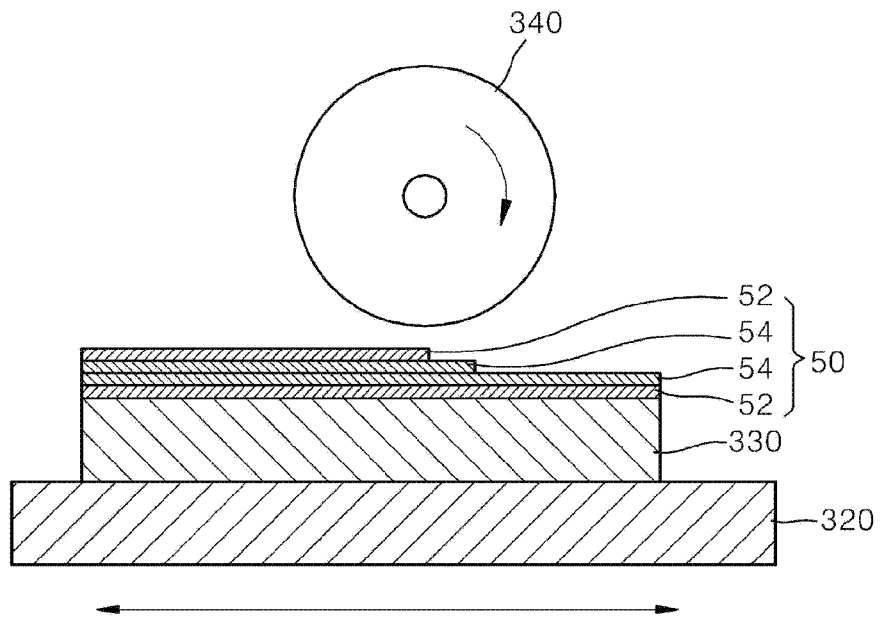
FIG. 24 is a schematic cross-sectional view of a method for forming a thin film using a plasma CVD device according to another embodiment of the present invention.

FIG. 23 is a schematic cross-sectional view of a method for forming a thin film using a plasma CVD device according to an embodiment of the present invention. FIG. 24 is a schematic cross-sectional view of a method for forming a thin film using a plasma CVD device according to another embodiment of the present invention.

Referring to FIG. 23, the substrate 330 can be scanned along at least one direction with respect to the rotating electrode 340 by moving the support plate 320 along at least one direction. In this embodiment, the velocity of movement of the substrate 330 can be controlled considering a degree of crystallinity of the thin film 50. For example, the degree of crystallinity of the thin film 50 may be controlled by varying the velocity of movement of the substrate 330 in a range of 0.5-50 mm/second. In this embodiment, a thin film 50 having a composite structure in which crystalline layers 52 and amorphous layers 54 are alternately stacked may be obtained.

As described above, a theoretical mechanism for scanning only once and forming a thin film 50 in which crystalline layers 52 and amorphous layers 54 are alternately stacked is not clear. However, it is understood that this composite structure is formed due to differences in plasma density caused by differences in gas flow rate between the upstream side and the downstream side on both sides of the rotating electrode 340 in relation to the direction of rotation of the rotating electrode. The inventor understands that the crystalline layers 52 are formed in the upstream region of one side of the rotating electrode 340 and amorphous layers 54 are formed in the downstream region of the other side of the rotating electrode 340, simultaneously. Meanwhile, it is understood that as the substrate 330 moves, the substrate 330 faces away from one side to the other side of the rotating electrode 340, and therefore the amorphous layer 54 can be continuously formed on the already-formed crystalline layer 52.

Meanwhile, the stacking order of the crystalline layer 52 and the amorphous layer 54 may be changed by changing the direction of rotation of the rotating electrode 340 or the direction of movement of the substrate 330. Furthermore, by repeatedly scanning the substrate 330 along one direction with respect to the rotating electrode 340, a multi-layered thin film in which crystalline layers 52 and amorphous layers 54 are alternately and repeatedly stacked may be produced.

Referring to FIG. 24, the substrate 330 may be reciprocally moved with respect to the rotating electrode 340 in either direction. Here, a thin film 50 having a composite structure in which crystalline layers 52 and amorphous layers 54 are alternately and repeatedly stacked may be obtained. Here, as the direction of movement of the substrate 330 may be changed midway, the order of stacking of crystalline layers 52 and amorphous layers 54 may be changed in the meantime. Therefore, two amorphous layers 52 are continuously stacked in the middle and therefore thicker than the crystalline layer 52 therebelow. However, if this reciprocal movement continues, the amorphous layers 54 and the crystalline layers 52, except the lowermost crystalline layer 52, will have double-layered structures and be alternately stacked. Here, although the two amorphous layers 54 in the middle were individually illustrated, they may not look substantially separated but may look like one layer.

Meanwhile, in a modified embodiment of this embodiment, a plurality of rotating electrodes (not shown) may be arranged on the substrate 330, and the substrate 330 may be continuously scanned along one direction or reciprocally scanned in either direction to go past the rotating electrodes.

Hereinafter, a method for forming a silicon thin film according to an experimental example of the present invention will be explained.

First, the substrate 330 is seated on the support plate 320 and then heated. For example, the support plate 320 may be heated to a temperature in the range of 300° C. to 300° C. If the temperature of the support plate 320 is below 300° C., crystallization does not easily occur. If the temperature of the support plate 320 is beyond 300° C., electrically properties of structures on the substrate 330, e.g., transparent electrodes, may be degraded. In this experimental example, the temperature of the hot plate 30 was maintained at 250° C.

Silane ($SiH_4$) and hydrogen ($H_2$) were used as reaction gases for depositing silicon, and helium (He) was used as inert gas. Meanwhile, hydrogen/silane gas flow ratio may range from 10 to 330, and the hydrogen/silane gas flow ratio was maintained at 70 in this embodiment while helium was injected into the chamber 310 at a flow rate of 10 liter/min for increasing densities of silane and hydrogen radicals.

The pressure of reaction gases in the chamber 310 may be maintained at about 30 to 600 Torr. In this embodiment, the reaction gases were injected until the pressure reached 300 Torr and the injection valve was closed thereafter to regulate the pressure. The gap between the substrate 330 and the rotating electrode 340 was maintained at about 0.5 mm, and plasma was generated by applying a 200 W of electric power to the rotating electrode 340 using a power supply with a frequency of about 350 MHz.

The support plate 320 on which the substrate 330 was mounted moved reciprocally in the right and left directions within a distance of 2.5 cm each with respect to the rotating electrode 340, and a silicon thin film was deposited on the substrate 330 with the velocity of movement of the substrate 330 varying in a range of 1 mm/sec to 25 mm/sec. The deposition time was fixed at 400 seconds regardless of the velocity of movement of the substrate 330, and the thickness of the silicon thin film that was deposited after 400 seconds was measured with a surface profiler and there were almost no differences in the thickness that was approximately 500±20 nm.

Figure 25:
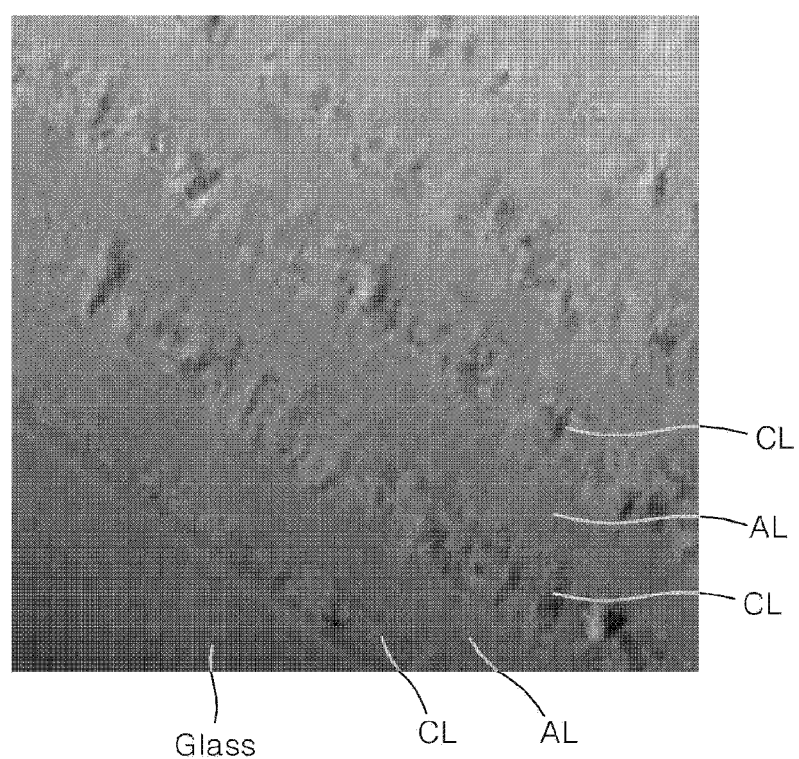
FIG. 25 is a TEM photograph showing a mixed structure of a silicon thin film formed according to an embodiment of the present invention.

FIG. 25 is a transmission electron microscope (TEM) photograph showing a cross-sectional view of a mixed structure of a silicon thin film that was formed when the velocity of movement of the substrate was 1 mm/sec.

Referring to FIG. 25, a silicon thin film having a mixed structure in which a plurality of crystalline layers CL and a plurality of amorphous layer AL were alternately stacked, that is a repeated structure of crystalline layer CL/amorphous layer AL/crystalline layer CL/amorphous layer AL, was obtained.

Figure 26:
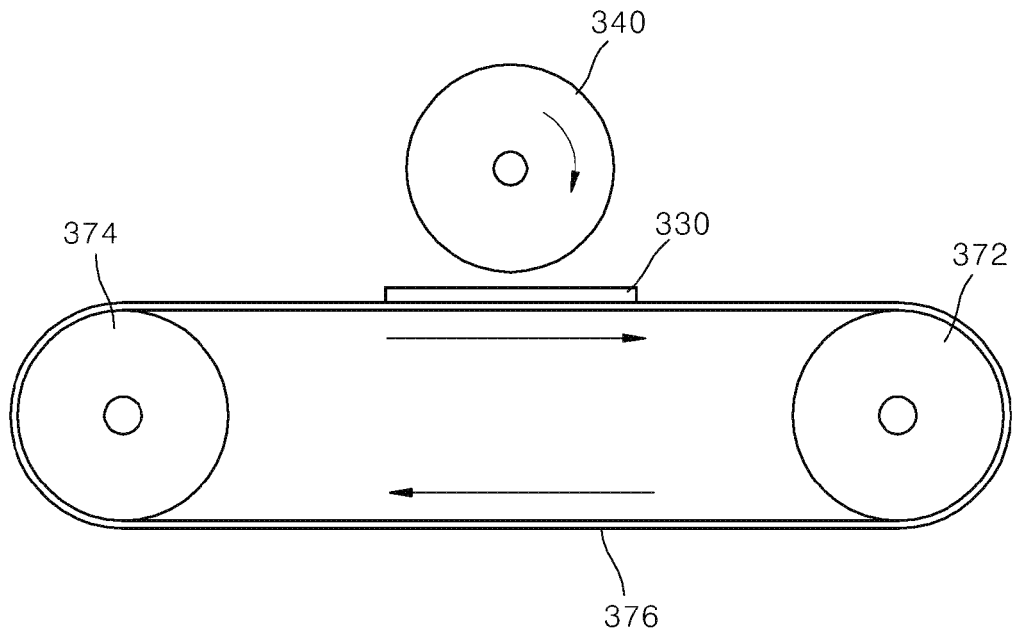
FIGS. 26-28 are schematic cross-sectional views of methods for manufacturing a thin film using a plasma CVD device according to yet other embodiments of the present invention.
Figure 27:
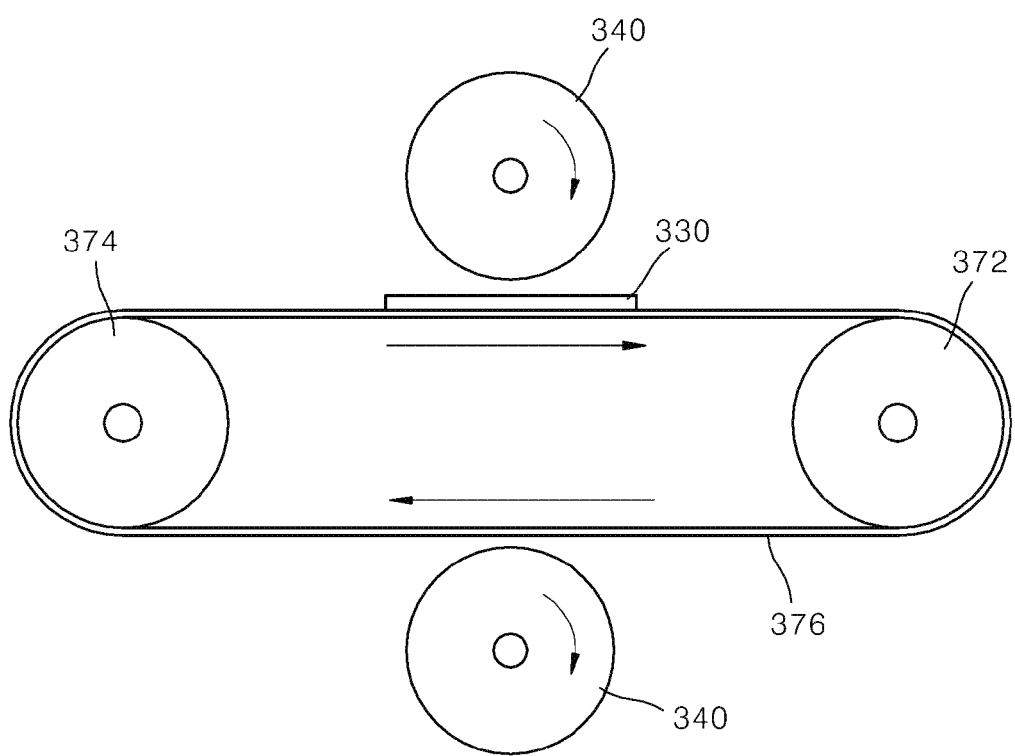
Figure 28:
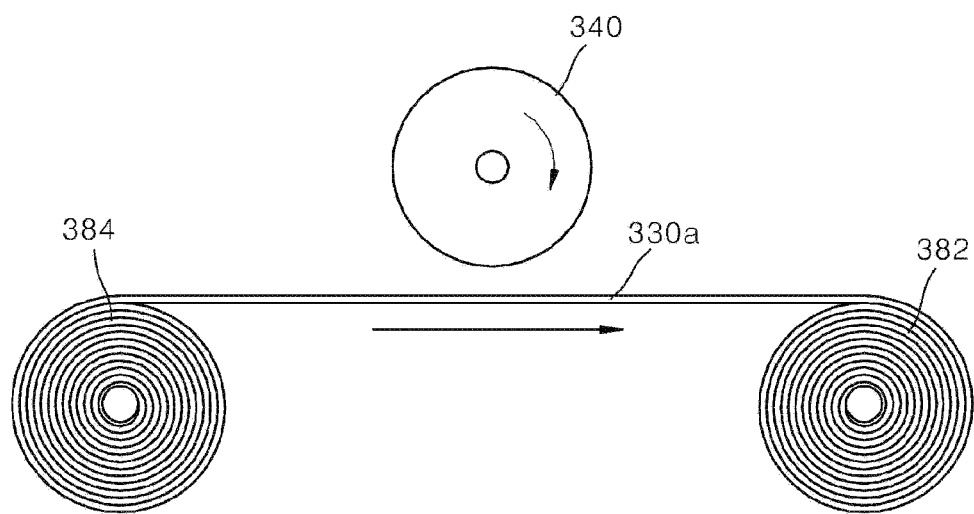

FIGS. 26-28 are schematic cross-sectional views of methods for manufacturing a thin film using a plasma CVD device according to yet other embodiments of the present invention. The methods for manufacturing a thin film according to these embodiments modified some elements of the methods for manufacturing a thin film according to the above described embodiments, and therefore overlapping explanations thereof will be omitted.

Referring to FIG. 26, the substrate 330 may continuously circulate between a pair of rollers 372 and 374 by a roll-to-roll process. For example, a belt 376 may circulate while connected to the rollers 372 and 374, and the substrate 330 may be coupled onto the belt 376. Here, the substrate 330 may be repeatedly scanned along one direction with respect to the rotating electrode 340. Accordingly, a stacked structure of the crystalline layer 52 and the amorphous layer 54 of the thin film 50 of FIG. 23 may be repeatedly deposited on the substrate 330. This roll-to-roll process is useful for performing a large-scale treatment of a large size substrate 330 using an atmospheric-pressure plasma device.

Meanwhile, in a modified embodiment of this embodiment, a plurality of rollers (not shown) may be added to the interior or exterior of the rollers 372 and 374. These additional rollers may be provided for tightening the belt 376 or changing the path of the belt 376.

Referring to FIG. 27, the substrate 330 may be provided between a pair of rollers 372 and 374, and a pair of rotating electrodes 340 may be provided above and below the belt 376. For example, a rotating electrode 340 may be provided above the upper side of the belt 376 and another rotating electrode 340 may be provided below the lower side of the belt 376. According to the above configuration, a mixed structure is deposited on the substrate 330 as the substrate 330 moves from left to right, and another mixed structure will be deposited as the substrate 330 moves left to right after moving around the roller 372. That is, the deposition velocity similar to that of a substrate 330 that moves reciprocally with respect to a rotating electrode 340 is obtained, thereby increasing productivity.

Referring to FIG. 28, a substrate 330*a* may move continuously along one direction between a pair of reels 382 and 384 by a reel-to-reel process. For example, the substrate 330 may be provided having a flexible material, wound around the reel 384 and then released to be continuously wound around the reel 382. The rotating electrode 340 may be arranged on the substrate 330*a* with a predetermined spacing therebetween. This reel-to-reel process is useful for performing a large-scale treatment of a large size substrate 330*a* using an atmospheric-pressure plasma device.

Meanwhile, in a modified embodiment of this embodiment, a plurality of rollers (not shown) may be added to the interior or exterior of the reels 382 and 384. These additional rollers may be provided for tightening the substrate 330*a* or changing the winding direction of the substrate 330*a*.

According to yet another embodiment of the present invention, a thin film may have a mixed structure in which microcrystals are distributed within amorphous layers. This structure of a thin film is controlled by controlling the velocity of movement of the substrate (330, FIG. 21). For example, a velocity of movement (a first velocity) of the substrate 330 for forming a mixed structure that includes the above described microcrystals may be greater than a velocity of movement (a second velocity) of the substrate 330 for forming a mixed structure in which crystalline layers and amorphous layers are alternately stacked. It is understood that this is because thin amorphous layers are formed as the velocity of movement of the substrate 330 increases, thereby preventing the growth of crystal grains.

Figure 29:
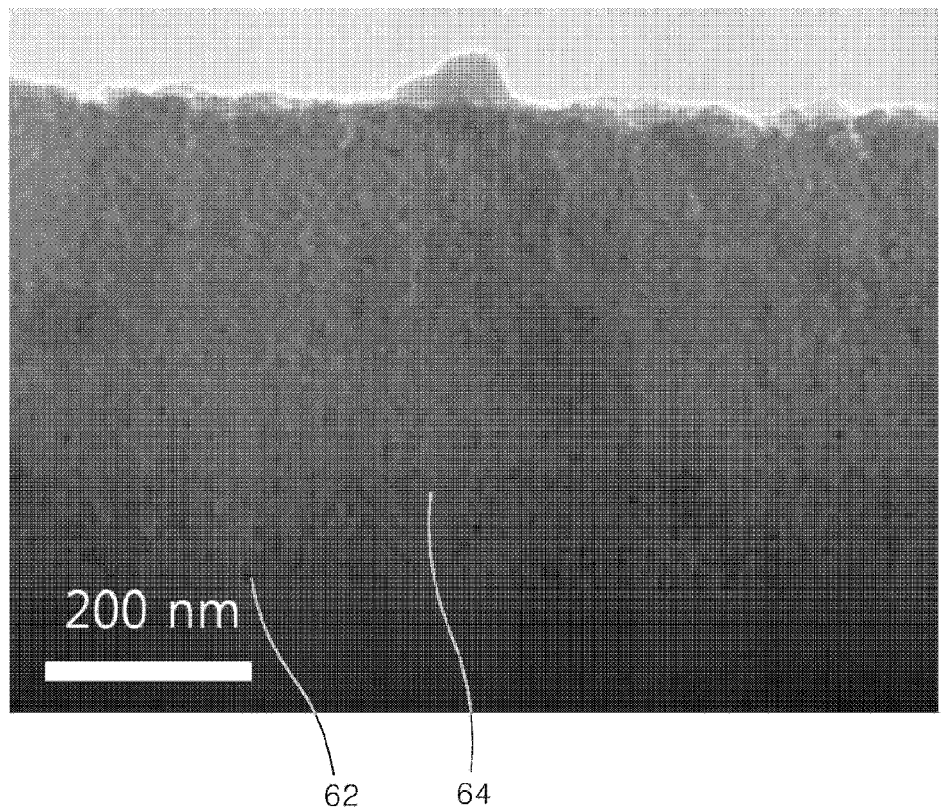
FIG. 29 is a TEM photograph showing a mixed structure of a thin film formed according to another experimental example of the present invention.
Figure 30:
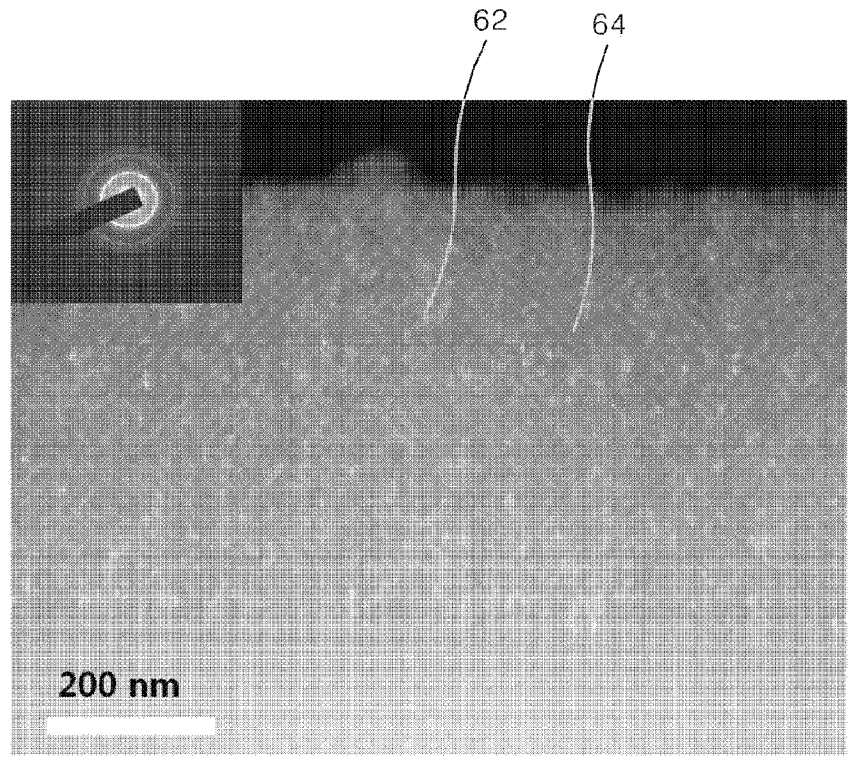
FIG. 30 shows a dark field TEM photograph of and a diffraction ring pattern of an interior area of the silicon thin film of FIG. 29.

For example, FIG. 29 is a TEM photograph showing a cross-sectional view of a mixed structure of a silicon thin film formed when the velocity of movement of the substrate was 8 mm/sec. FIG. 30 shows a dark field TEM photograph of and a diffraction ring pattern of an interior area of the silicon thin film of FIG. 29. A dark-field TEM is an analyzing method in which areas having crystalline structure appear bright.

Referring to FIG. 29, silicon microcrystals 62 are evenly distributed within the amorphous silicon layer 64. Referring to FIG. 30, the white dots shown in a dark filed TEM photograph, namely silicon microcrystals 62, regularly appear along the thickness direction. Therefore, it is confirmed that the silicon microcrystals have a size of about 10 nm, and are evenly distributed within the amorphous silicon layer 64. Meanwhile, a diffraction ring pattern analysis shows that the microcrystal grains 62 show a ring pattern of silicon crystal planes of (111), (220) and (311) and the microcrystals 62 have a lattice structure of silicon.

These experimental examples of FIGS. 25 and 29 show that a mixed structure within a thin film can be controlled by changing the velocity of movement of the substrate 330. Furthermore, if the velocity of movement of the substrate 330 is changed during the formation of the thin film, a thin film that includes both a structure in which amorphous layers and crystalline layers are alternately stacked as shown in FIG. 25, and a structure in which microcrystals are evenly distributed within an amorphous layer as shown in FIG. 29 may be obtained.

A thin film having the above described mixed structure may be applied in various industrial fields, e.g., semiconductor devices, solar cells, displays, etc. For example, the thin film may be used as diode layers for solar cells or water vapor permeability protection layer for flexible substrates.

While the present invention has been described in connection with what is presently considered to be practical exemplary embodiments as shown in the accompanying drawings, it is to be understood that the invention is not limited to the disclosed embodiments, but, on the contrary, is intended to cover various modifications and equivalent arrangements included within the spirit and scope of the appended claims.

What is claimed is:

1. A plasma generator comprising:
a plate-shaped lower electrode for seating a substrate; and
a cylindrical rotating electrode on the plate-shaped lower electrode,
wherein the cylindrical rotating electrode includes
an electrically conductive body that is connected to a power supply and includes a plurality of capillary units on an outer circumferential surface of the electrically conductive body; and
an insulation shield layer that is disposed on the outer circumferential surface of the body and exposes a lower surface of the plurality of capillary units.

2. The plasma generator of claim 1,
wherein the shield layer exposes the lower surface of the plurality of capillary units and shields other part.

3. The plasma generator of claim 1, further comprising:
an electrically conductive layer on the lower surface of the capillary unit, and
wherein the electrically conductive layer includes at least one of a metal, an alloy, an electrically conductive ceramic, an electrically conductive carbon body, and an electrically conductive polymer, that has a higher secondary electron emission coefficient than the lower surface.

4. The plasma generator of claim 1,
wherein the plurality of capillary units extends along the direction of a rotation shaft of the body, and
wherein the plurality of capillary units are regularly arranged with a constant spacing.

5. The plasma generator of claim 1, further comprising:
a chamber in which the plate-shaped lower electrode and the cylindrical rotating electrode are disposed,
wherein the chamber includes a reaction gas inlet and a reaction gas outlet.

6. The plasma generator of claim 1,
wherein the width of the capillary units ranges from 100 μm to 10 mm, and the aspect ratio of the capillary units ranges from 1 to 200.

7. A manufacturing method of a rotating electrode for a plasma generator, the method comprising the steps of:
proving an electrically conductive body that includes a plurality of capillary units; and
forming an insulation shield layer on the outer circumferential surface of the body to expose at least part of the lower surface of the plurality of capillary units.

8. The method of claim 7,
wherein the step of forming an insulation shield layer includes the steps of:
forming a dielectric layer to cover the outer circumferential surface of the body; and
selectively removing the dielectric layer on at least part of the lower surface of the plurality of capillary units.

9. The method of claim 8,
wherein the step of forming a dielectric layer is carried out by an anodic oxidation method or thin film deposition method.

10. The method of claim 8,
wherein the electrically conductive body is made of an electrically conductive material that includes aluminum, and
wherein the step of forming a dielectric layer includes the step of forming an alumina layer on the electrically conductive body by an anodic oxidation method or thin film deposition method.

11. The method of claim 8,
wherein the electrically conductive body is made of an electrically conductive material except aluminum, and
wherein the step of forming a dielectric layer includes the steps of:
forming an aluminum layer to cover the outer circumferential surface of the body by a thin film deposition method; and
performing a phase transformation in which the aluminum layer is transformed to an alumina layer by an anodic oxidation method.

12. The method of claim 8,
wherein the electrically conductive body is made of an electrically conductive material except aluminum, and
wherein the step of forming a dielectric layer includes the step of forming an alumina layer to cover the outer circumferential surface of the body by a thin film deposition method.

13. The method of claim 8,
wherein the step of selectively removing the dielectric layer is carried out by a diamond cutting method or a laser cutting method.

14. The method of claim 7,
wherein the step of forming an insulation shield layer includes the steps of:
forming a mask layer on the lower surface of the plurality of capillary units; and
selectively forming a dielectric layer on the outer circumferential surface of the body that is exposed from the mask layer.

15. The method of claim 7,
wherein the step of proving an electrically conductive body that includes a plurality of capillary units includes the steps of:
providing a cylindrical core that includes a first electrically conductive substance;
forming an outer circumferential layer that includes a second electrically conductive substance on the cylindrical core; and
forming a plurality of capillary units by removing part of the outer circumferential surface so that the cylindrical core is exposed and concave-convex shapes appear.

16. The method of claim 15,
wherein the step of forming a plurality of capillary units includes the step of removing the part of the outer circumferential layer so that the cylindrical core is exposed, by a diamond cutting method or a laser cutting method.

17. The method of claim 15,
wherein the step of forming an insulation shield layer includes the step of forming a dielectric layer on the outer circumferential layer in which concave-convex shapes appear so that at least part of the lower surface of the capillary units is exposed, under conditions in which the dielectric layer can be selectively formed only on the second electrically conductive substance of the first and second electrically conductive substances.

18. The method of claim 17,
wherein the first electrically conductive substance includes iron, the second electrically conductive substance includes aluminum, and the dielectric layer includes aluminum oxide ($Al_2O_3$).

* * * * *